(12) United States Patent
Tak et al.

(10) Patent No.: US 9,899,565 B2
(45) Date of Patent: Feb. 20, 2018

(54) METHOD OF MANUFACTURING SEMICONDUCTOR SUBSTRATE INCLUDING SEPARATING TWO SEMICONDUCTOR LAYERS FROM A GROWTH SUBSTRATE

(71) Applicant: Samsung Electronics Co., Ltd., Suwon-si, Gyeonggi-do (KR)

(72) Inventors: Young Jo Tak, Hwaseong-si (KR); Sam Mook Kang, Hwaseong-si (KR); Mi Hyun Kim, Seoul (KR); Jun Youn Kim, Hwaseong-si (KR); Young Soo Park, Yongin-si (KR); Misaichi Takeuchi, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/183,869

(22) Filed: Jun. 16, 2016

(65) Prior Publication Data

US 2017/0069785 A1    Mar. 9, 2017

(30) Foreign Application Priority Data

Sep. 7, 2015 (KR) .................. 10-2015-0126184

(51) Int. Cl.
*H01L 33/00* (2010.01)
*H01L 21/683* (2006.01)
(Continued)

(52) U.S. Cl.
CPC ...... *H01L 33/0075* (2013.01); *H01L 21/0254* (2013.01); *H01L 21/0262* (2013.01);
(Continued)

(58) Field of Classification Search
CPC ............ H01L 33/0075; H01L 21/6835; H01L 21/7806; H01L 21/30604; H01L 21/02381;
(Continued)

(56) References Cited

U.S. PATENT DOCUMENTS 6,372,608 B1   4/2002  Shimoda et al.
6,645,830 B2   11/2003 Shimoda et al.
(Continued)

FOREIGN PATENT DOCUMENTS

KR       10-0809211 B1    2/2008
KR    10-2011-0031631 A   3/2011
(Continued)

*Primary Examiner* — Selim Ahmed
(74) *Attorney, Agent, or Firm* — Harness, Dickey & Pierce, P.L.C.

(57) ABSTRACT

A method of manufacturing a semiconductor substrate may include forming a first semiconductor layer on a growth substrate, forming a second semiconductor layer on the first semiconductor layer, forming a plurality of voids in the first semiconductor layer by removing portions of the first semiconductor layer that are exposed by a plurality of trenches in the second semiconductor layer, forming a third semiconductor layer on the second semiconductor layer and covering the plurality of trenches, and separating the second and third semiconductor layers from the growth substrate. on the first semiconductor layer. The third semiconductor layer are grown from the second semiconductor layer and extend above the second semiconductor layer.

20 Claims, 17 Drawing Sheets

(51) Int. Cl.
*H01L 21/306* (2006.01)
*H01L 21/78* (2006.01)
*H01L 21/02* (2006.01)

(52) U.S. Cl.
CPC .. *H01L 21/02381* (2013.01); *H01L 21/30604* (2013.01); *H01L 21/6835* (2013.01); *H01L 21/7806* (2013.01); *H01L 33/0066* (2013.01); *H01L 33/0079* (2013.01)

(58) Field of Classification Search
CPC ............. H01L 33/0066; H01L 33/0079; H01L 21/0254; H01L 21/0262; H01L 33/12; H01L 21/02647; H01L 21/0265
USPC .......... 438/739, 740, 39, 41, 42, 44; 257/84, 257/85, E21.121, E33.005, E33.006, 257/E33.024
See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,924,159 B2 | 8/2005 | Usui et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,196,399 B2 | 3/2007 | Usui et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,207,054 B2 | 6/2012 | Shibata |
| 8,247,310 B2 | 8/2012 | Tsang |
| 8,263,987 B2 | 9/2012 | Choi et al. |
| 8,324,646 B2 | 12/2012 | Lee et al. |
| 8,334,156 B2 | 12/2012 | Kim et al. |
| 8,349,076 B2 | 1/2013 | Song et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,716,749 B2 | 5/2014 | Kim et al. |
| 8,735,931 B2 | 5/2014 | Han et al. |
| 8,766,295 B2 | 7/2014 | Kim |
| 8,877,652 B2 | 11/2014 | Kim et al. |
| 9,006,084 B2 | 4/2015 | Sakai |
| 2006/0148186 A1 | 7/2006 | Lee et al. |
| 2011/0121357 A1* | 5/2011 | Lester ................. H01L 21/0237 257/103 |
| 2017/0047479 A1* | 2/2017 | Hertkorn ............. H01L 21/0242 |

FOREIGN PATENT DOCUMENTS

| | | |
|---|---|---|
| KR | 10-1117189 B1 | 3/2012 |
| KR | 10-1137907 B1 | 5/2012 |
| KR | 10-2013-0076335 A | 7/2013 |
| KR | 10-1377970 B1 | 3/2014 |
| KR | 10-2014-0148200 A | 12/2014 |
| WO | WO-2014/030815 A1 | 2/2014 |

\* cited by examiner

METHOD OF MANUFACTURING SEMICONDUCTOR SUBSTRATE INCLUDING SEPARATING TWO SEMICONDUCTOR LAYERS FROM A GROWTH SUBSTRATE

CROSS-REFERENCE TO RELATED APPLICATION

This application claims the priority under 35 U.S.C. § 119 to Korean Patent Application No. 10-2015-0126184, filed on Sep. 7, 2015, in the Korean Intellectual Property Office, the entire disclosure of which is incorporated herein by reference.

BACKGROUND

The present disclosure relates to a method of manufacturing a semiconductor substrate.

A semiconductor light emitting device may be a next-generation light source and may have features such as a relatively long lifespan, low power consumption, fast response speed, environmental friendliness, and the like. The semiconductor light emitting device has come to prominence as a light source in various types of products such as lighting devices and backlights of displays. In particular, a nitride-based light emitting device based on a Group III nitride such as GaN, AlGaN, InGaN, or InAlGaN plays an important role in outputting blue or ultraviolet light as a semiconductor light emitting device.

A sapphire substrate, a silicon (Si) substrate, or a GaN substrate may be used as a substrate used in manufacturing a semiconductor light emitting device. In particular, in a case in which a nitride-based light emitting device is manufactured using a GaN substrate, defects in the nitride-based light emitting device may be significantly reduced. In the manufacturing of such a GaN substrate, technology of manufacturing a large semiconductor substrate using a more simplified process without increasing manufacturing costs is desired.

SUMMARY

Example embodiments relate to a method of manufacturing a semiconductor substrate that is easily manufactured.

According to example embodiments of inventive concepts, a method of manufacturing a semiconductor substrate may include: forming a first semiconductor layer on a growth substrate, forming a second semiconductor layer on the first semiconductor layer, the second semiconductor layer including a plurality of trenches, forming a plurality of voids in the first semiconductor layer by removing portions of the first semiconductor layer exposed by the plurality of trenches, forming a third semiconductor layer on the second semiconductor layer and covering the plurality of trenches, the third semiconductor layer being grown from the second semiconductor layer and extending above the second semiconductor layer, and separating the second and third semiconductor layers integrally from the growth substrate.

According to example embodiments of inventive concepts, a method of manufacturing a semiconductor substrate may include: forming a stack structure using a growth substrate and a first semiconductor layer, forming a second semiconductor layer on the first semiconductor layer, the second semiconductor layer including a plurality of trenches, forming a plurality of voids in the first semiconductor layer using the second semiconductor layer as a mask, forming a third semiconductor layer on the second semiconductor layer, and separating the second and third semiconductor layers integrally from the growth substrate.

According to example embodiments of inventive concepts, a method of manufacturing a semiconductor substrate may include: forming a first semiconductor layer on a growth substrate, forming a second semiconductor layer on the first semiconductor layer, a lattice constant value of the second semiconductor layer value less than a lattice constant value of the first semiconductor layer, and the second semiconductor layer including a plurality of trenches, forming a plurality of voids in the first semiconductor layer removing portions of the first semiconductor layer exposed by the second semiconductor layer between the plurality of trenches, widths of the voids being greater than widths of the plurality of trenches, forming a third semiconductor layer on the second semiconductor layer and covering the plurality of trenches, the third semiconductor layer extending above the second semiconductor layer, and a thermal expansion coefficient of the third semiconductor layer being different from a thermal expansion coefficient of the growth substrate, and separating the second and third semiconductor layers integrally from the growth substrate.

According to example embodiments of inventive concepts, a method of manufacturing a semiconductor substrate may include: forming a plurality of semiconductor layers on a growth substrate, and separating a stack from the growth substrate. The plurality of semiconductor layers include a first semiconductor layer, a second semiconductor layer on the first semiconductor layer, and a third semiconductor layer on the second semiconductor layer. The second semiconductor layer includes segments laterally spaced apart from each other. Each of the segments has an upper width that is greater than a lower width, and sidewalls corresponding to a crystal facet of the second semiconductor layer. A lattice constant value of the second semiconductor layer is less than a lattice constant value of the first semiconductor layer. The third semiconductor layer is grown from the second semiconductor layer. A thermal expansion coefficient of the third semiconductor layer is different than a thermal expansion coefficient of the growth substrate. The first and third semiconductor layers define a plurality of closed spaces in the first semiconductor layer below lowermost portions of the third semiconductor layer. The stack includes the second semiconductor layer and the third semiconductor layer. The separating the stack includes generating cracks in the first semiconductor layer.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
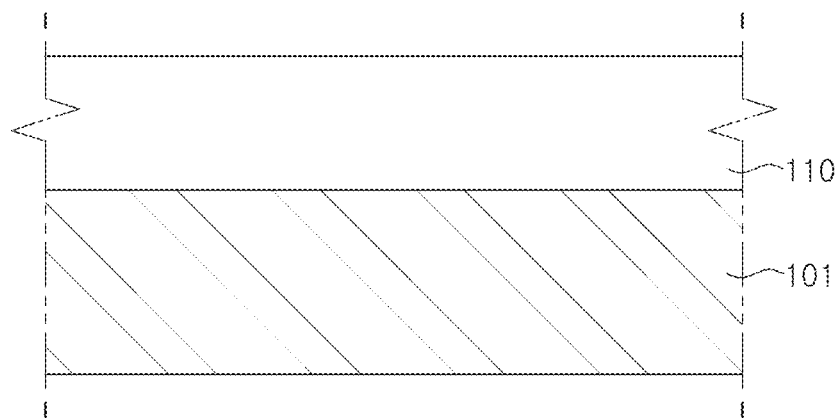
FIGS. 1 through 6 are schematic cross-sectional views of a method of manufacturing a semiconductor substrate according to example embodiments of inventive concepts, respectively.

Various embodiments will now be described more fully with reference to the accompanying drawings in which some embodiments are shown. Example embodiments of inventive concepts may, however, be embodied in different forms and should not be construed as limited to the embodiments set forth herein. Rather, these embodiments are provided so that this disclosure is thorough and complete and fully conveys the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath," "below," "lower," "above," "upper" and the like, may be used herein for ease of description to describe one element's or feature's relationship to another element (s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising, "comprises", "includes" and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an embodiment can be implemented differently, functions or operations described in a particular block may occur in a different way from a flow described in the flowchart. For example, two consecutive blocks may be performed simultaneously, or the blocks may be performed in reverse according to related functions or operations.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure is illustrated in a cross-sectional view, an electronic device may include a plurality of the device structures, as would be illustrated by a plan view of the electronic device. The plurality of device structures may be arranged in an array and/or in a two-dimensional pattern.

FIGS. 1 through 6 are schematic cross-sectional views of a method of manufacturing a semiconductor substrate according to example embodiments of inventive concepts, respectively.

Referring to FIG. 1, a first semiconductor layer 110 may be formed on a growth substrate 101 to prepare a stack structure of the growth substrate 101 and the first semiconductor layer 110.

The growth substrate 101 may be provided as a substrate for semiconductor growth, and may be a heterogeneous substrate of gallium nitride (GaN), for example, a semiconductor layer which is desired to be grown. The growth substrate 101 may be formed using an insulating, conductive, or semiconductive material, such as silicon (Si), sapphire, SiC, $MgAl_2O_4$, MgO, $LiAlO_2$, and $LiGaO_2$. When Si, for example, a monocrystalline Si wafer of 6 or more inches, is used as the growth substrate 101, such a Si substrate may have a large caliber and may be relatively inexpensive, and productivity may thus be improved. For growth of a nitride-based compound, a (111) plane of a Si substrate may be used. According to example embodiments, the growth substrate 101 may contain an impurity in at least a portion thereof.

The first semiconductor layer 110 may have voids formed in a following process, may be monocrystalline, and may have a composition of $Al_xIn_yGa_{1-x-y}N$ ($0 \le x < 1$, $0 \le y < 1$, $0 \le x+y < 1$). The first semiconductor layer 110 may include a plurality of layers, such as GaN, AlGaN, or InGaN. According to example embodiments, the first semiconductor layer 110 may include GaN.

The first semiconductor layer 110 may be formed on the growth substrate 101 by a metal organic chemical vapor deposition (MOCVD) process or a hydride vapor phase epitaxy (HVPE) process.

The forming of the first semiconductor layer 110 may further include forming a limiting layer. The limiting layer may have a low removal rate, and thus removal of the first semiconductor layer 110 may not be performed. According to example embodiments, the limiting layer may be formed of the same material as a second semiconductor layer 120 of a following process. The present process may be selectively performed. The limiting layer may suppress a removal range of the first semiconductor layer 110 to limit a length of a void.

Figure 2:
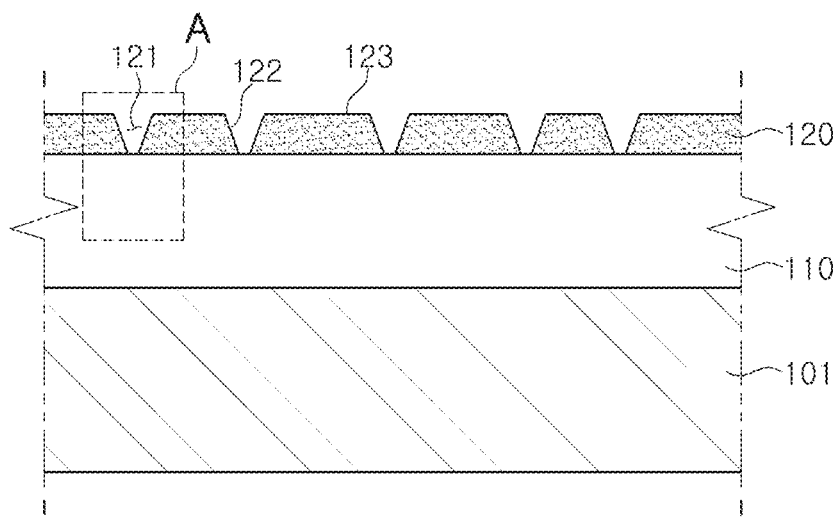

Referring to FIG. 2, the second semiconductor layer 120 having a plurality of trenches 121 may be formed on the first semiconductor layer 110.

The second semiconductor layer 120 may be epitaxially grown from the first semiconductor layer 110, and the plurality of trenches 121 may be integrally formed in a process of growing the second semiconductor layer 120. The second semiconductor layer 120 may be used as a mask for forming voids 111 in a following process.

The second semiconductor layer 120 may be monocrystalline, and may have a composition of $Al_xIn_yGa_{1-x-y}N$ ($0 \le x < 1$, $0 \le y < 1$, $0 \le x+y < 1$). The second semiconductor layer 120 may include a plurality of layers, such as GaN, AlGaN, or InGaN. According to example embodiments, the second semiconductor layer 120 may include AlGaN. The first semiconductor layer 110 and the second semiconductor layer 120 may be formed the different material having different composition. According to example embodiments, the first semiconductor layer 110 may be formed of GaN, and the second semiconductor layer 120 may be formed of AlGaN.

The second semiconductor layer 120 may be formed on the first semiconductor layer 110 by an MOCVD process or an HVPE process.

At this time, the second semiconductor layer 120 may have a lattice constant value less than that of the first semiconductor layer 110. Such a difference between the lattice constant values of the first and second semiconductor layers 110 and 120 may allow the second semiconductor layer 120 to receive tensile stress when the second semiconductor layer 120 is grown. Conversely, because of having a lattice constant value greater than that of the second semiconductor layer 120, the first semiconductor layer 110 may be subjected to tensile stress.

The tensile stress applied to the second semiconductor layer 120 may be stronger as the difference between the lattice constant values of the first and second semiconductor layers 110 and 120 is increased, and may be stronger as the second semiconductor layer 120 becomes thicker.

Therefore, as the second semiconductor layer 120 is grown, the second semiconductor layer 120 may be subjected to stronger tensile stress. While the second semiconductor layer 120 is grown, the plurality of trenches 121 may be generated in the surface thereof to reduce tensile stress on the second semiconductor layer 120. Thus, the plurality of trenches 121 may be integrally formed by the difference between the lattice constant values of the first and second semiconductor layers 110 and 120. The trenches 121 may be generated when the lattice constant value of the second semiconductor layer 120 is in a range of 1.2% to 2.4% less than the lattice constant value of the first semiconductor layer 110.

The trenches 121 may also be integrally formed when the second semiconductor layer 120 is grown to have a desired (and/or alternatively predetermined) thickness or more in the case that the lattice constant value of the second semiconductor layer 120 is 1.2% less than the lattice constant value of the first semiconductor layer 110. The thickness of the second semiconductor layer 120 in which the trenches 121 are formed may range, for example, from 10 nm to 200 nm.

The trenches 121 may pass through the second semiconductor layer 120, and may be spaced apart from each other. When viewed from above, each of the trenches 121 may have a shape in which a plurality of polygons including segments having directivity overlap each other. The respective trenches 121 may be defined by surfaces 122 formed on the second semiconductor layer 120. The surfaces 122 may be inclined based on each of upper surfaces 123 of the second semiconductor layer 120. Shapes of the trenches 121 may be changed depending on compositions and growth conditions of the second semiconductor layer 120. At least a portion of the surfaces 122 may correspond to a crystal facet of the second semiconductor layer 120.

Figure 3:
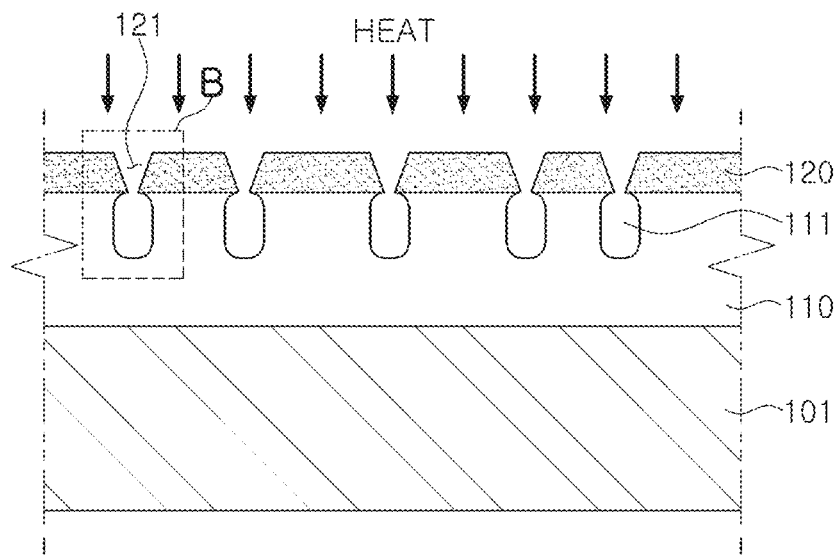

Referring to FIG. 3, the first semiconductor layer 110 may have voids 111 formed therein.

The plurality of voids 111 may be formed below the plurality of trenches 121, respectively, to be connected the plurality of trenches 121, respectively. The voids 111 may be formed by removing the first semiconductor layer 110 to a desired (and/or alternatively predetermined) depth. The voids 111 may be formed by thermally treating the first semiconductor layer 110 under a hydrogen ($H_2$) atmosphere. The voids 111 may also be formed by dry etching or wet etching the first semiconductor layer 110.

Figure 11A:
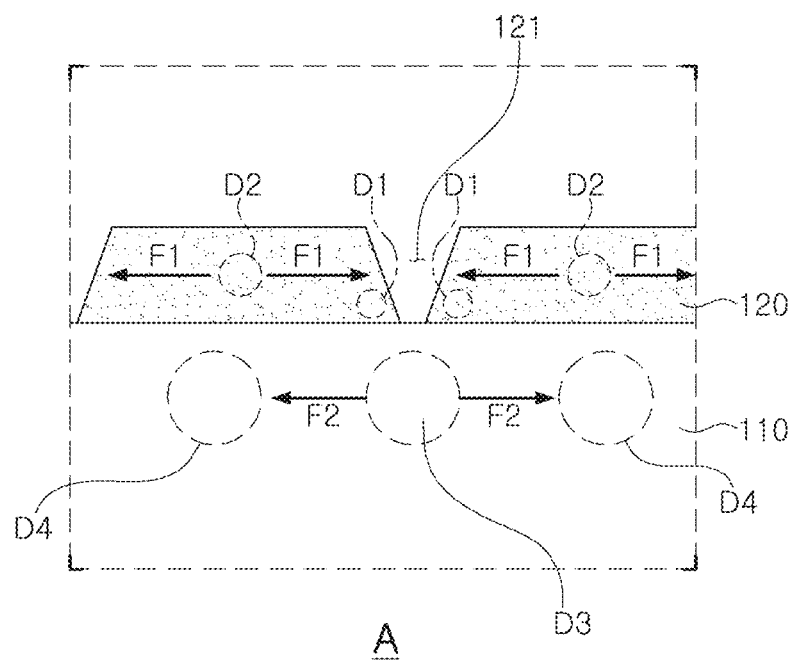
FIGS. 11A and 11B are views of processes of generating voids of FIG. 3, respectively.
Figure 11B:
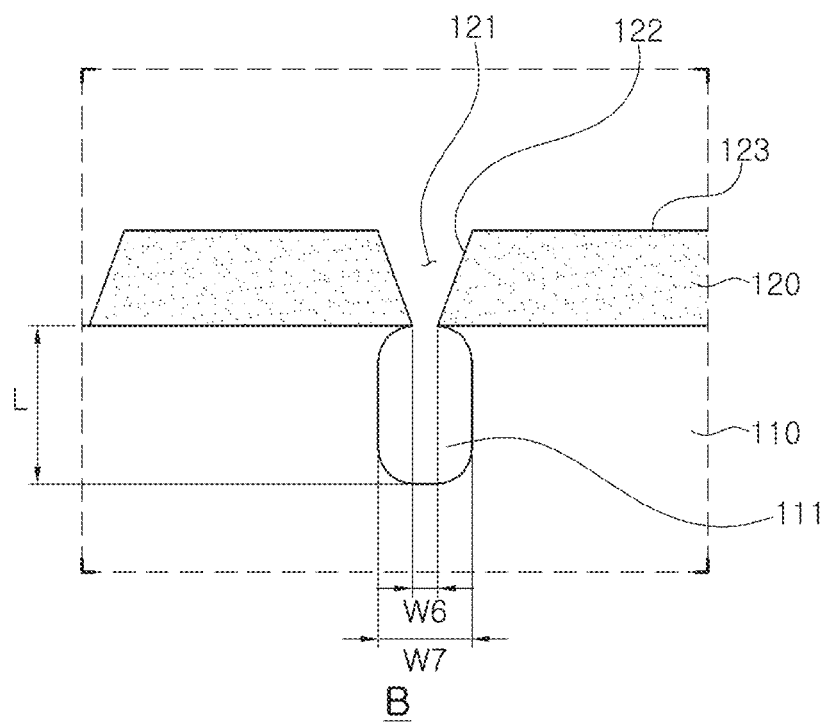

This will be described with reference to FIGS. 11A and 11B. FIG. 11A is an enlarged view of A of FIG. 2 being in a state before the voids 111 are formed in the first semiconductor layer 110, and FIG. 11B is an enlarged view of B of FIG. 3 in which the voids 111 are formed in the first semiconductor layer 110.

Referring to FIG. 11A, the second semiconductor layer 120 having a lattice constant value relatively less than that of the first semiconductor layer 110 may receive tensile stress F1 due to the difference between the lattice constant values of the first and second semiconductor layers 110 and 120. The first semiconductor layer 110 having a relatively greater lattice constant value than that of the second semiconductor layer 120 may receive compression stress. As described above, tensile stress F1 on the second semiconductor layer 120 may be increased as the second semiconductor layer 120 becomes thicker. Therefore, because regions D1 of the second semiconductor layer 120 adjacent to each of the trenches 121 have relatively reduced thicknesses than those of regions D2, relatively less tensile stress F1 may occur in comparison to the regions D2.

In response to this, relatively less compression stress may be applied to a region D3 of the first semiconductor layer 110 below each of the trenches 121. As a result, the region D3 to which relatively less compression stress is applied may be influenced by compression stress on regions D4 to which a relatively great compression stress is applied, so that a resultant force F2 of tensile stress may be applied to the region D3. Therefore, the region D3 may receive the resultant force F2 of tensile stress, being relatively and easily removed in comparison with the regions D4.

When the first and second semiconductor layers 110 and 120 are heated under a hydrogen atmosphere, the region D3 of the first semiconductor layer 110 may allow a condition, in which deposition is more dominant than thermal desorption, to be maintained. If such a condition is maintained, as illustrated in FIG. 11B, the region D3 of the first semiconductor layer 110 may be selectively removed, so that the voids 111 may be formed. Because the voids 111 may be formed along the region D3 relatively and easily removed, the voids 111 may have overall long cross sections in a longitudinal direction of the first semiconductor layer 110. Widths W6 of the voids 111 may be greater than widths W7 of the trenches 121. In addition, because the region D3 is positioned below each of the trenches 121, the voids 111 may have directivity corresponding to that of the trenches 121, when viewed from above. According to example embodiments, the first semiconductor layer 110 may be formed of GaN, and the second semiconductor layer 120 may be formed of AlGaN. While AlGaN has a low removal rate under a hydrogen atmosphere, GaN has a high removal rate thereunder. When the first and second semiconductor layers 110 and 120 are heated under a hydrogen atmosphere, the first semiconductor layer 110 may only be selectively removed. Therefore, the second semiconductor layer 120 may be used as a mask for forming the voids 111 in the first semiconductor layer 110. The forming of the voids 111 and the forming of the trenches 121 may be performed in an identical process.

Figure 12A:
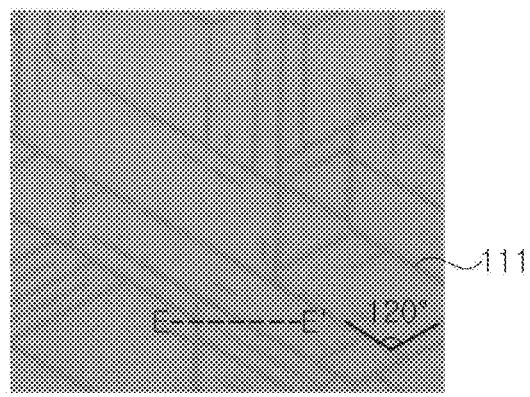
FIGS. 12A through 12C are photographs obtained by imaging the voids of FIG. 3, respectively.
Figure 12B:
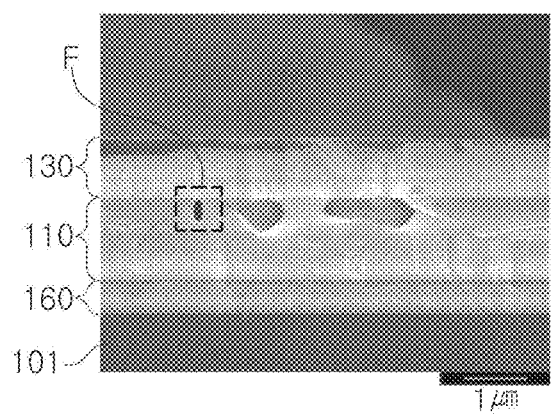
Figure 12C:
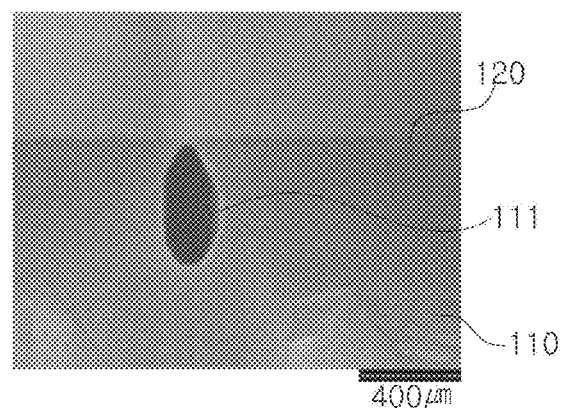

Referring to real photographs, shapes in which the voids 111 are formed will be described. FIG. 12A is a photograph obtained by imaging a shape in which the voids 111 are formed from the top thereof. FIG. 12B is a photograph obtained by imaging a cross-sectional view taken along line E-E' of FIG. 12A. FIG. 12C is an enlarged photograph of F of FIG. 12B. Referring to FIG. 12A, when viewed from above, the voids 111 may have a shape in which polygons including segments having directivity overlap each other, and may be disposed parallel in a crystal direction [0110] of GaN to form an internal angle of 120 degrees therebetween. Referring to FIGS. 12B and 12C, cross sections of the voids 111 may be overall elongated. A reference numeral 160 may refer to a buffer layer described below.

Figure 4:
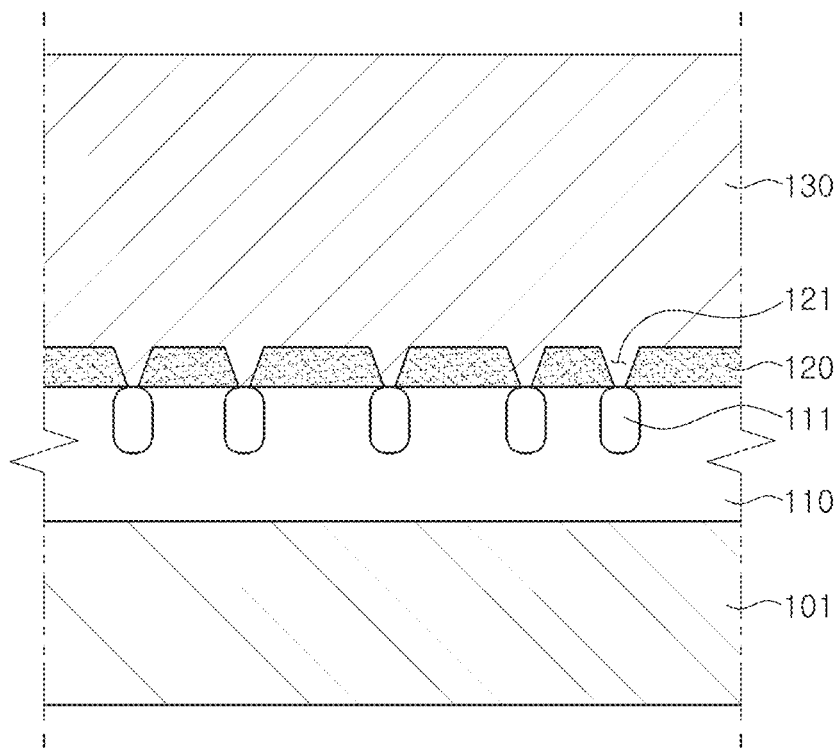

Referring to FIG. 4, the second semiconductor layer 120 may have a third semiconductor layer 130 formed thereon.

The third semiconductor layer 130 may be epitaxially grown from the second semiconductor layer 120. The third semiconductor layer 130 may be monocrystalline, and may have a composition of $Al_xIn_yGa_{1-x-y}N$ ($0 \leq x<1$, $0 \leq y<1$, $0 \leq x+y<1$). The third semiconductor layer 130 may be grown from the second semiconductor layer 120 to fill the trenches 121. At this time, the third semiconductor layer 130 may be slowly grown or may not be grown in the voids 111 of the first semiconductor layer 110 due to geometric characteristics of the voids 111. Therefore, even when the first semiconductor layer 110 may be grown within the voids 111, the voids 111 may remain as empty spaces.

As the trenches 121 are filled with the third semiconductor layer 130 grown above the voids 111, the voids 111 may be covered with the third semiconductor layer 130 to form closed regions in the first semiconductor layer 110.

The third semiconductor layer 130 may be grown by an HVPE process. In this case, because growth speed of GaN is faster in comparison to an MOCVD process, the third semiconductor layer 130 may be grown to be large and thick.

Figure 5:
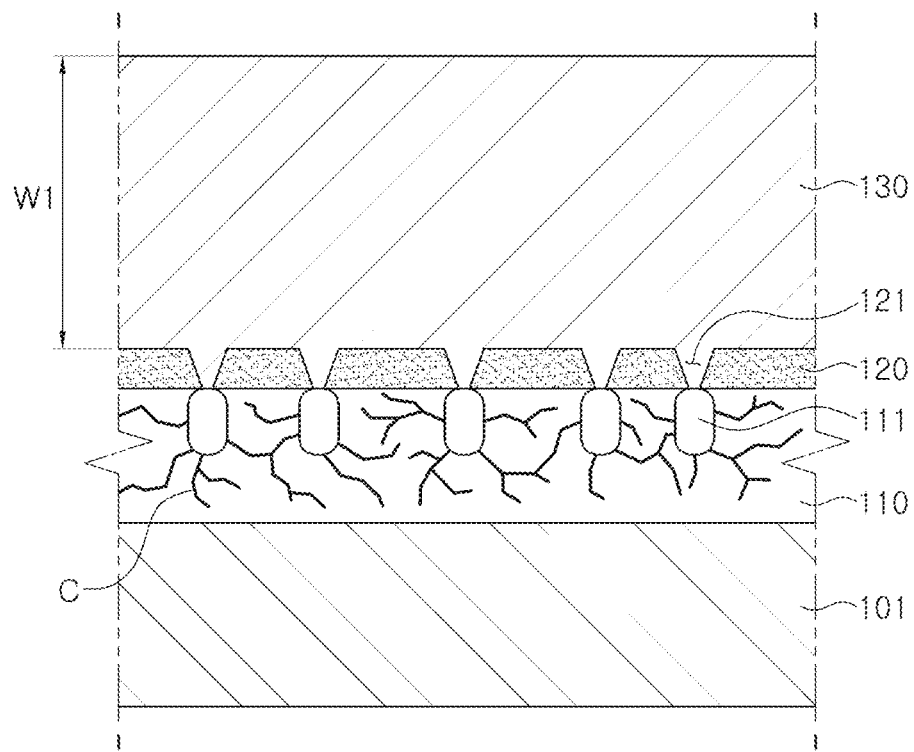
Figure 6:
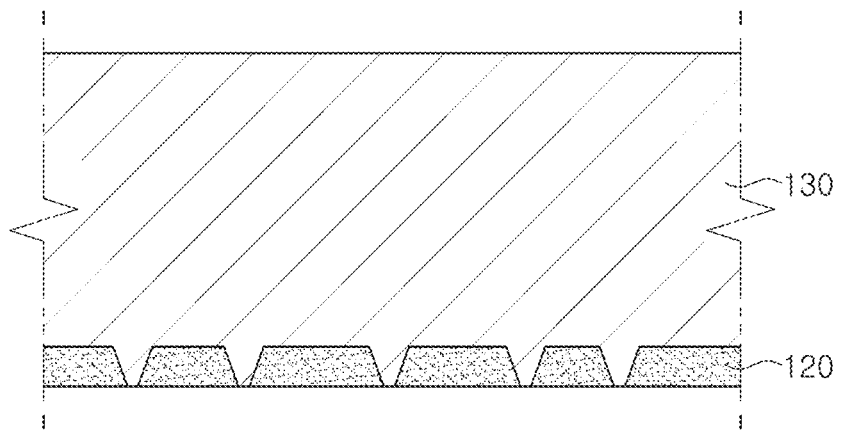

Referring to FIGS. 5 and 6, cracks C may occur in the first semiconductor layer 110 so that the second and third semiconductor layers 120 and 130 may be integrally separated.

When the third semiconductor layer 130 is grown to have a desired (and/or alternatively predetermined) thickness W1, and is then cooled, stress due to a difference between thermal expansion coefficients of the growth substrate 101 and the third semiconductor layer 130, or the like, may be concentrated on the voids 111. Accordingly, the cracks C may occur from the voids 111, and may transversely spread in the first semiconductor layer 110. Therefore, the cracks C occurring in a portion of the first semiconductor layer 110 may spread to the whole of the first semiconductor layer 110, so that the second and third semiconductor layers 120 and 130 may be separated from the growth substrate 101.

Such separation may be induced by the voids 111, and may be integrally performed in a process of growing the third semiconductor layer 130 to the desired (and/or alternatively predetermined) thickness W1 and cooling it according to sizes of the voids 111. The thickness W1 of the third semiconductor layer 130 at which the separation occurs may range, for example, from 2 nm to 100 nm, and adjustment of the sizes of the voids 111 considering the thickness W1 of the third semiconductor layer 130 may allow such an integral separation to be induced.

In example embodiments of inventive concepts, the method of manufacturing a semiconductor substrate may not require a separate process when the third semiconductor layer 130 is formed and the growth substrate 101, for example, a heterogeneous substrate, is then removed, thereby simplifying the entire process. In addition, it may not be required to form a separate artificial pattern in order to form the trenches 121 and the voids 111, and thus the entire process may be simplified. Furthermore, since the entire process may include a process of forming a semiconductor layer, the entire process may be implemented in situ within a single chamber.

Next, the third semiconductor layer 130 may be sliced into a plurality of semiconductor substrates.

The slicing process may be selectively performed, and the third semiconductor layer 130 may be sliced for a purpose thereof, thereby manufacturing a plurality of semiconductor substrates. The slicing process may be omitted depending on a thickness of a target semiconductor substrate, and according to example embodiments, may also be performed in such a manner that a region including the second semiconductor layer 120 below the third semiconductor layer 130 may only be removed.

Semiconductor substrates may be used in manufacturing a semiconductor device as freestanding substrates, respectively. For example, each of the semiconductor substrates may be used in growing GaN semiconductor layers thereabove to manufacture a semiconductor light emitting device.

Figure 7:
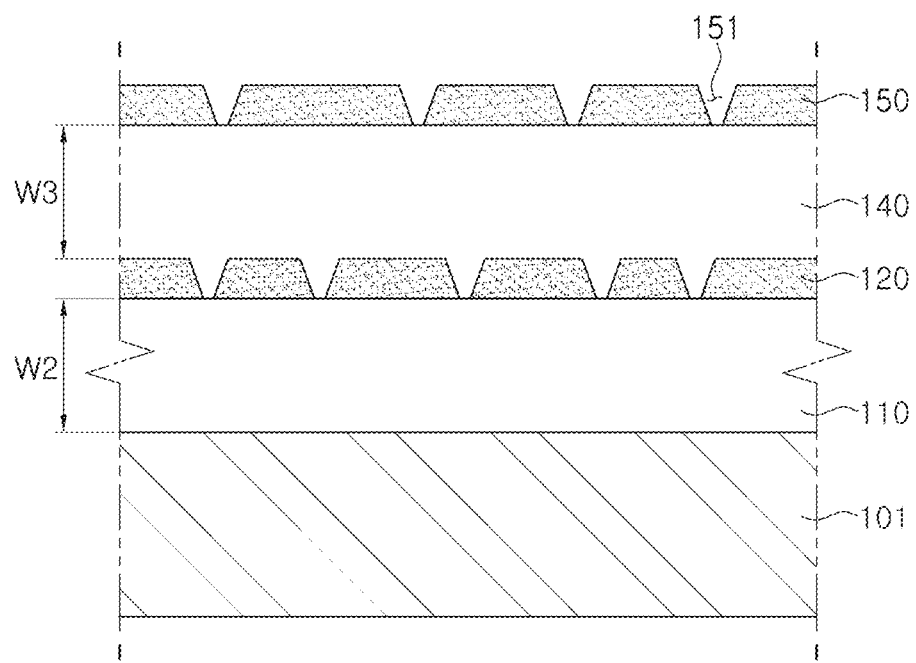
FIGS. 7 through 9 are schematic cross-sectional views of a method of manufacturing a semiconductor substrate according to example embodiments of inventive concepts, respectively.
Figure 8:
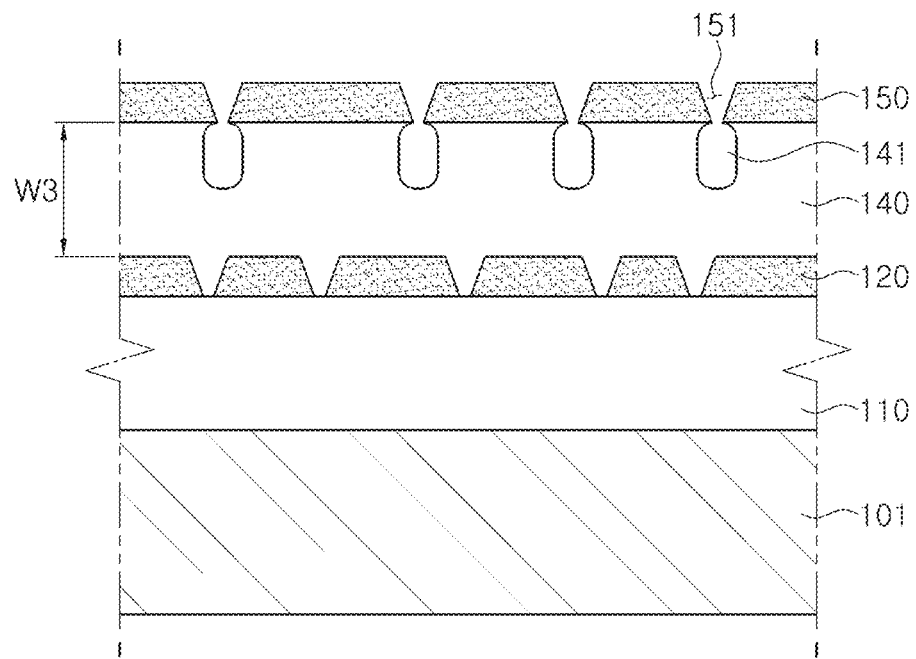
Figure 9:
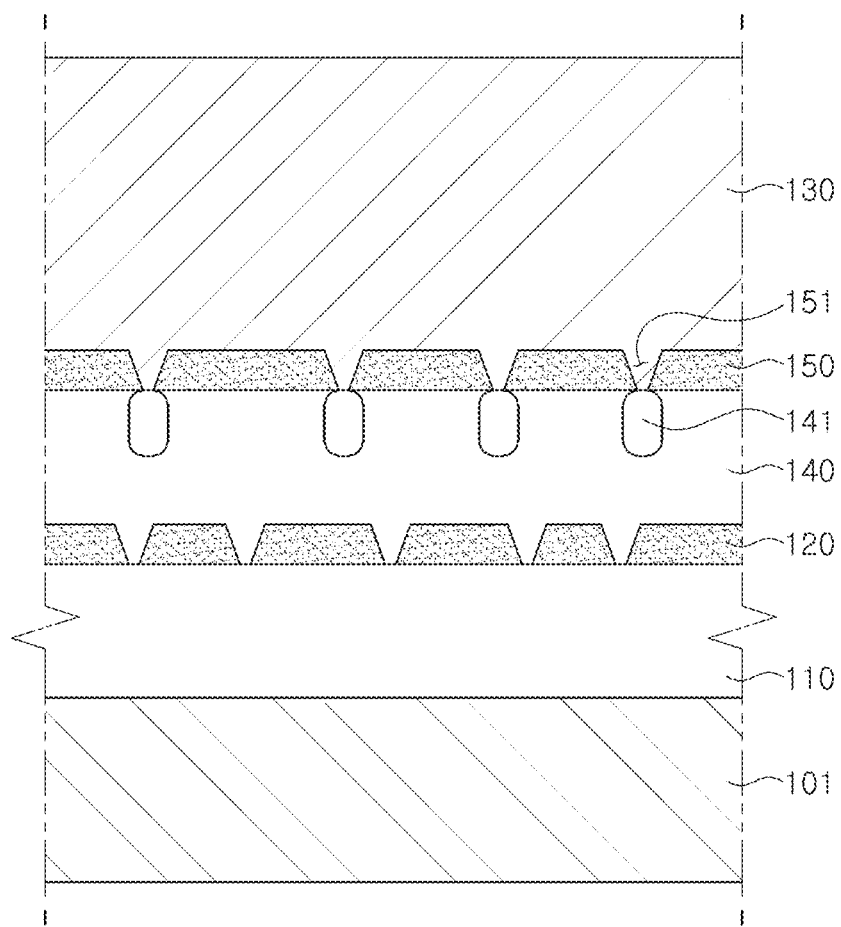

FIGS. 7 through 9 are schematic cross-sectional views of a method of manufacturing a semiconductor substrate according to example embodiments of inventive concepts, respectively.

First, as described above with reference to FIGS. 1 and 2, processes of forming the second semiconductor layer 120 having the plurality of trenches 121 on the growth substrate 101 in which the first semiconductor layer 110 is formed, may be performed.

Next, referring to FIG. 7, an additional first semiconductor layer 140 and an additional second semiconductor layer 150 having a plurality of trenches 151 may be formed on the second semiconductor layer 120. The thickness W3 of the additional first semiconductor layer 140 may be different from a thickness W2 of the first semiconductor layer 110. A thickness W3 of the additional first semiconductor layer 140 may be determined according to sizes of voids 141 to be formed in a following process.

Next, referring to FIG. 8, the voids 141 may be formed in the additional first semiconductor layer 140. Because the second semiconductor layer 120 disposed below the additional first semiconductor layer 140 may have a lower removal rate than that of the additional first semiconductor layer 140, the second semiconductor layer 120 may be used as a layer limiting the sizes of the voids 141.

Next, as illustrated in FIG. 9, the third semiconductor layer 130 may be formed on the additional second semiconductor layer 150.

Next, as described above with reference to FIGS. 5 and 6, the additional second semiconductor layer 150 and the third semiconductor layer 130 may be integrally separated from the growth substrate 101.

Figure 10:
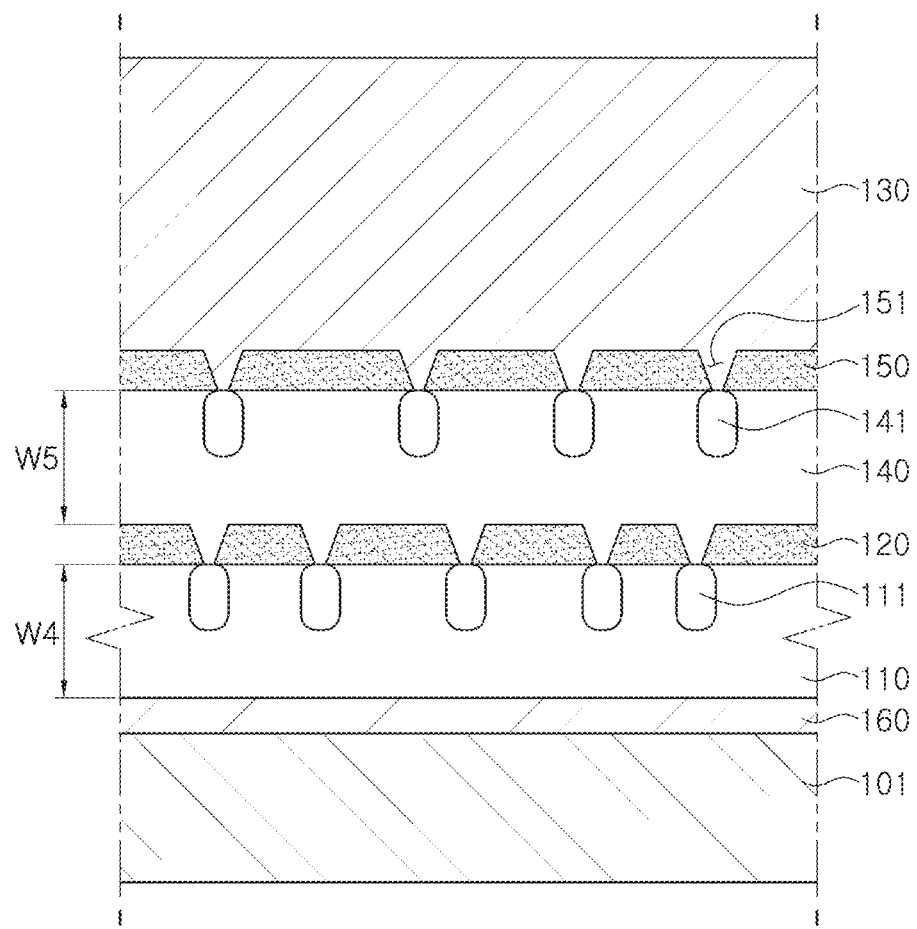
FIG. 10 is a schematic cross-sectional view of a method of manufacturing a semiconductor substrate according to example embodiments of inventive concepts.

FIG. 10 is a schematic cross-sectional view of a method of manufacturing a semiconductor substrate according to example embodiments of inventive concepts.

First, as described above with reference to FIGS. 1 through 3, processes of forming the second semiconductor layer 120 having the plurality of trenches 121 on the growth substrate 101 on which the first semiconductor layer 110 is formed, and forming the plurality of voids 111 in the first semiconductor layer 110, may be performed. Prior to forming the first semiconductor layer 110, a buffer layer 160 may be formed on the growth substrate 101.

The buffer layer 160 may include a single layer or a plurality of layers as a layer improving crystallinity of semiconductor layers which are desired to be grown. The buffer layer 160 may have a thermal expansion coefficient different from that of the growth substrate 101, and may therefore contain a material having a thermal expansion coefficient different from that of the growth substrate 101. When the growth substrate 101 is provided as a silicon (Si) substrate, a thermal expansion coefficient thereof may be about $2.6 \times 10^{-6}$/K ((111) Plane) or about $3.7 \times 10^{-6}$/K ((100) Plane). When the growth substrate 101 is provided as a SiC substrate, a thermal expansion coefficient thereof may be $4.2 \times 10^{-6}$/K to $4.7 \times 10^{-6}$/K. Thus, when the buffer layer 160 includes GaN, a thermal expansion coefficient thereof may be $5.59 \times 10^{-6}$/K, resulting in a difference between the thermal expansion coefficients of the growth substrate 101 and the buffer layer 160.

For example, the buffer layer 160 may contain an $Al_xIn_yGa_{1-x-y}N$ ($0 \leq x \leq 1$, $0 \leq y < 1$, $0 \leq x+y \leq 1$) material. When the buffer layer 160 includes a plurality of layers, the layers may have a multilayer structure including, for example, a single layer of AlN, SiC, $Al_2O_3$, AlGaN, AlInGaN, AlInBGaN, AlBGaN, GaN, and XY, or combinations thereof. Here, X may be Ti, Cr, Zr, Hf, Nb, or Ta, and Y may be nitrogen (N) or boron (B, $B_2$). According to example embodiments, the buffer layer 160 directly contacting the growth substrate 101 may include AlN to form a core for epitaxial growth of a semiconductor layer, and to limit (and/or prevent) a melt back effect forming a eutectic metal by reacting silicon (Si) included in the growth substrate 101 with gallium (Ga) included in the first semiconductor layer 110.

The buffer layer 160 may be formed on the growth substrate 101 by an MOCVD or HVPE process.

Next, as described above with reference to FIGS. 7 and 8, the additional first and second semiconductor layers 140 and 150 may be formed on the second semiconductor layer 120, and the voids 141 may be formed in the additional first semiconductor layer 140. In order to adjust the sizes of the voids 141, a thickness W5 of the additional first semiconductor layer 140 may be different from a thickness W4 of the first semiconductor layer 110.

Next, as described above with reference to FIG. 9, the third semiconductor layer 130 may be formed on the additional second semiconductor layer 150.

Next, as described above with reference to FIGS. 5 and 6, the additional second semiconductor layer 150 and the third semiconductor layer 130 may be integrally separated from the growth substrate 101.

Figure 13:
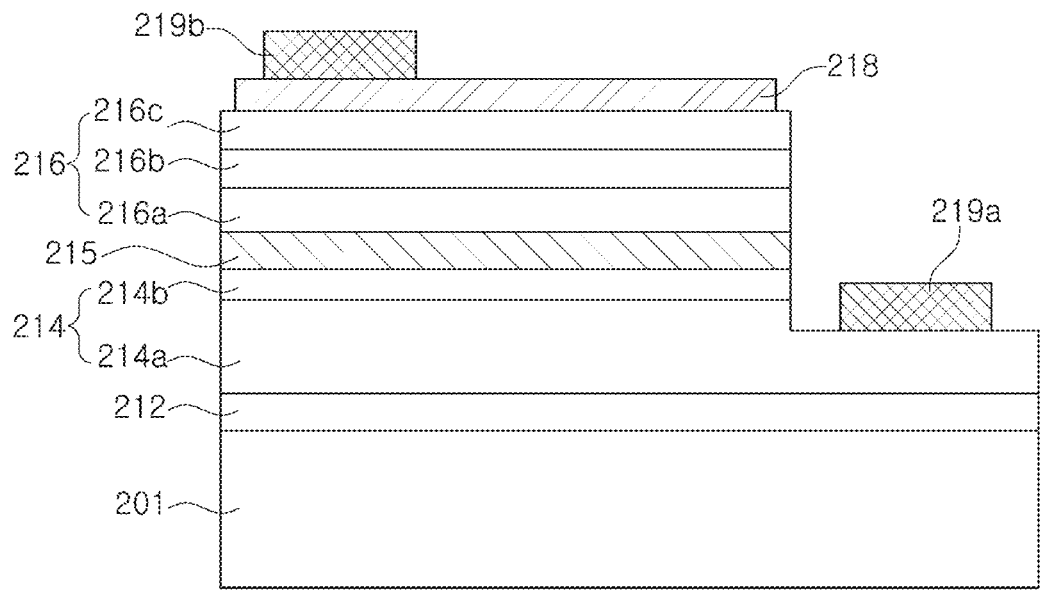
FIGS. 13 through 15 are cross-sectional views of examples of semiconductor light emitting devices including a semiconductor substrate manufactured according to example embodiments of inventive concepts, respectively.
Figure 14:
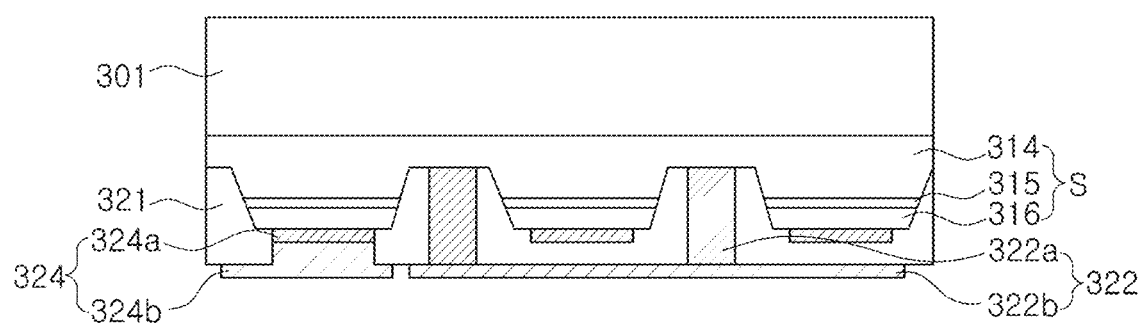
Figure 15:
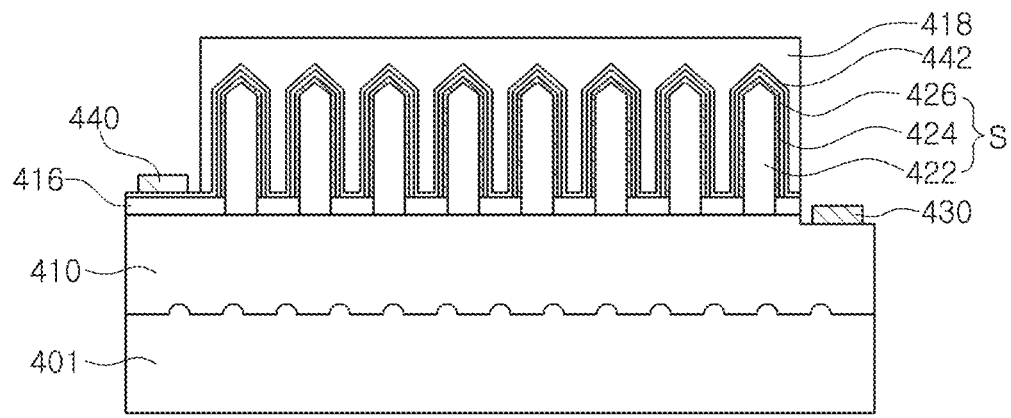

FIGS. 13 through 15 are cross-sectional views of examples of semiconductor light emitting devices including a semiconductor substrate manufactured according to example embodiments of inventive concepts, respectively.

Referring to FIG. 13, a semiconductor light emitting device 200 may include a substrate 201, and a first conductive semiconductor layer 214, an active layer 215, and a second conductive semiconductor layer 216 sequentially disposed on the substrate 201. The semiconductor light emitting device 200 may further include a buffer layer 212 disposed between the substrate 201 and the first conductive semiconductor layer 214. The semiconductor light emitting device 200 may further include a first electrode 219a disposed on the first conductive semiconductor layer 214, and an ohmic contact layer 218 and a second electrode 219b sequentially disposed on the second conductive semiconductor layer 216.

The substrate 201 may be provided as a GaN substrate, and may be manufactured by a method of manufacturing a semiconductor substrate according to example embodiments described above with reference to FIGS. 1 through 12.

The buffer layer 212 may include $In_xAl_yGa_{1-x-y}N$ ($0\leq x\leq 1$, $0\leq y\leq 1$). For example, the buffer layer 212 may include GaN, AlN, AlGaN, or InGaN. According to example embodiments, the buffer layer 12 may also be formed by combining a plurality of layers or gradually changing a composition thereof.

The first conductive semiconductor layer 214 may include a nitride semiconductor layer satisfying n-type $In_xAl_yGa_{1-x-y}N$ ($0\leq x<1$, $0\leq y<1$, $0\leq x+y<1$), and an n-type impurity may be silicon (Si). For example, the first conductive semiconductor layer 214 may include n-type GaN.

According to the present example embodiment, the first conductive semiconductor layer 214 may include a first conductive semiconductor contact layer 214a and a current diffusion layer 214b. A concentration of an impurity included in the first conductive semiconductor contact layer 214a may range from $2\times 10^{18}$ cm$^{-3}$ to $9\times 10^{19}$ cm$^{-3}$. A thickness of the first conductive semiconductor contact layer 214a may range from 1 µm to 5 µm. The current diffusion layer 214b may have a structure in which a plurality of $In_xAl_yGa_{1-x-y}N$ ($0\leq x$, $y\leq 1$, $0\leq x+y\leq 1$) layers respectively having different compositions or different impurity contents are repeatedly stacked. For example, the current diffusion layer 214b may be an n-type GaN layer having a thickness of 1 nm to 500 nm and/or an n-type superlattice layer in which at least two layers respectively having different compositions of $Al_xIn_yGa_zN$ ($0\leq x$, $y$, $z\leq 1$, excluding $x=y=z=0$) are repeatedly stacked. A concentration of an impurity included in the current diffusion layer 214b may range from $2\times 10^{18}$ cm$^{-3}$ to $9\times 10^{19}$ cm$^{-3}$. According to example embodiments, an additional insulating material layer may be introduced within the current diffusion layer 214b.

The second conductive semiconductor layer 216 may include a nitride semiconductor layer satisfying p-type $In_xAl_yGa_{1-x-y}N$ ($0\leq x<1$, $0\leq y<1$, $0\leq x+y<1$), and a p-type impurity may be magnesium (Mg). For example, the second conductive semiconductor layer 216 may be implemented as a monolayer structure, but as in the present example embodiment, may have a multilayer structure having different compositions. As illustrated in FIG. 13, the second conductive semiconductor layer 216 may include an electron blocking layer (EBL) 216a, a low-concentration p-type GaN layer 216b, and a high-concentration p-type GaN layer 216c. For example, the EBL 216a may have a structure in which a plurality of $In_xAl_yGa_{1-x-y}N$ ($0\leq x\leq 1$, $0\leq y\leq 1$, $0\leq x+y\leq 1$) layers having different compositions and having a thickness of 5 nm to 100 nm, respectively, are stacked, or may include a single layer having a composition of $Al_yGa_{1-y}N$ ($0<y\leq 1$). An energy band gap (Eg) of the EBL 216a may be reduced farther away from the active layer 215. For example, an aluminum (Al) composition of the EBL 216a may be reduced farther away from the active layer 215.

The active layer 215 may have a multiple quantum well (MQW) structure in which quantum well layers and quantum barrier layers are alternately stacked on each other. For example, the quantum well layers and the quantum barrier layers may include $In_xAl_yGa_{1-x-y}N$ ($0\leq x\leq 1$, $0\leq y\leq 1$, $0\leq x+y\leq 1$) having different compositions. According to example embodiments, the quantum well layers may include $In_xGa_{1-x}N$ ($0<x\leq 1$), and the quantum barrier layers may include GaN or AlGaN. Thicknesses of the quantum well layers and the quantum barrier layers may range from 1 nm to 50 nm, respectively. A structure of the active layer 215 may not be limited to the MQW structure, and may also have a single quantum well (SQW) structure.

The first electrode 219a may contain a material such as Ag, Ni, Al, Cr, Rh, Pd, Ir, Ru, Mg, Zn, Pt, or Au, and may be employed as a structure having a single layer or two or more layers. According to example embodiments, a pad electrode layer may be further disposed on the first electrode 219a. The pad electrode layer may include at least one of materials such as Au, Ni, and Sn.

The ohmic contact layer 218 may be implemented in a variety of manners according to a mounting structure when packaged. For example, in the case of a flip-chip structure, the ohmic contact layer 218 may contain a metal such as Ag, Au, or Al, or a transparent conductive oxide such as ITO, ZIO, or GIO. For example, in the case of a structure in which light is emitted upwardly in the illustrated drawing, the ohmic contact layer 218 may include a light emitting electrode. The light emitting electrode may include one of a transparent conductive oxide layer or a nitride layer. The light emitting electrode may include at least one selected from indium tin oxide (ITO), zinc-doped indium tin oxide (ZITO), zinc indium oxide (ZIO), gallium indium oxide (GIO), zinc tin oxide (ZTO), fluorine-doped tin oxide (FTC)), aluminum-doped zinc oxide (AZO), gallium-doped zinc oxide (GZO), $In_4Sn_3O_{12}$, and $Zn_{(1-x)}Mg_xO$ (Zinc Magnesium Oxide, $0\leq x\leq 1$). According to example embodiments, the ohmic contact layer 218 may also contain graphene. The second electrode 219b may contain at least one of Al, Au, Cr, Ni, Ti, and Sn.

Referring to FIG. 14, a semiconductor light emitting device 300 may include a substrate 301 and a semiconductor stack S formed on the substrate 301. The semiconductor stack S may include a first conductive semiconductor layer 314, an active layer 315, and a second conductive semiconductor layer 316. The semiconductor light emitting device 300 may further include a first electrode 322 and a second electrode 324 respectively connected to the first conductive semiconductor layer 314 and the second conductive semiconductor layer 316.

The substrate 301 may be provided as a GaN substrate, and may be manufactured by a method of manufacturing a semiconductor substrate according to example embodiments described above with reference to FIGS. 1 through 12.

The first electrode 322 may include connecting electrode portions 322a having a conductive via shape and passing through the second conductive semiconductor layer 316 and the active layer 315 to be connected to the first conductive semiconductor layer 314, and a first electrode pad 322b connected to the connecting electrode portions 322a. The connecting electrode portions 322a may be surrounded by insulating portions 321 to be electrically separated from the active layer 315 and the second conductive semiconductor layer 316. The connecting electrode portions 322a may be disposed in an area in which the semiconductor stack S is etched. The connecting electrode portions 322a may be properly designed in number, shape, pitch or contact area with the first conductive semiconductor layer 314 in such a manner that contact resistance may be reduced. The connecting electrode portions 322a may also be arranged to form rows and columns on the semiconductor stack S to improve current flow.

The second electrode 324 may include an ohmic contact layer 324a on the second conductive semiconductor layer 316 and a second electrode pad 324b. The connecting electrode portions 322a and the ohmic contact layer 324a may have a monolayer or a multilayer structure formed of the first and second conductive semiconductor layers 314 and 316 and a conductive material having ohmic characteristics. For example, the connecting electrode portions 322a and the ohmic contact layer 324a may include at least one of materials such as Ag, Al, Ni, Cr, and a transparent conductive oxide (TCO).

The first and second electrode pads 322b and 324b may be connected to the connecting electrode portions 322a and the ohmic contact layer 324a, respectively, to function as an external terminal of the semiconductor light emitting device 300. For example, the first and second electrode pads 322b and 324b may contain Au, Ag, Al, Ti, W, Cu, Sn, Ni, Pt, Cr, NiSn, TiW, AuSn, or eutectic metals thereof. The first and second electrodes 322 and 324 may be disposed with each other in an identical direction, and may be mounted on a lead frame or the like in a form of a flip chip.

The first and second electrodes 322 and 324 may be electrically isolated from each other by the insulating portions 321. The insulating portions 321 may include an insulating material, and may be used with a material having low light absorption. For example, the insulating portions 321 may be used with a silicon oxide or a silicon nitride, such as $SiO^2$, $SiO_xN_y$, or $Si_xN_y$.

According to example embodiments, the insulating portions 321 may also have a light-reflective structure in which a light-reflective filler is dispersed into a light transmitting material. Alternatively, the insulating portions 321 may have a multilayer reflective structure in which a plurality of insulating layers having different refractive indexes, respectively, are alternately stacked. For example, such a multilayer reflective structure may be provided as a distributed Bragg reflector (DBR) in which a first insulating film having a first refractive index and a second insulating film having a second refractive index are alternately stacked. The multilayer reflective structure may have a structure in which a plurality of insulating films having different refractive indexes, respectively, are repeatedly stacked from 2 to 100 times. The plurality of insulating films may include an oxide such as $SiO_2$, $TiO_2$, $Al_2O_3$, or $ZrO_2$, a nitride such as SiN, $Si_3N_4$, TiN, AlN, TiAlN, or TiSiN, and combinations thereof, such as $SiO_xN_y$. For example, when a wavelength of light generated by the active layer 315 is defined as λ, and n is defined as a refractive index of a corresponding insulating layer, the first and second insulating films may have thicknesses of λ/4n, respectively, for example, thicknesses of about 300 Å to about 900 Å. At this time, the multilayer reflective structure may be designed by selecting refractive indexes and thicknesses of the first and second insulating films, respectively, in order to have high reflectivity (95% or more) for the wavelength of light generated by the active layer 315. The refractive indexes of the first and second insulating films may be determined in a range of about 1.4 to about 2.5, and may be less than a refractive index of the first conductive semiconductor layer 314.

Referring to FIG. 15, a semiconductor light emitting device 400 may include a substrate 401 and light emitting nanostructures S disposed on the substrate 401. Each of the light emitting nanostructures S may include a first conductive semiconductor core 422, an active layer 424, and a second conductive semiconductor layer 426. The semiconductor light emitting device 400 may also further include a base layer 410 and an insulating layer 416 disposed between the substrate 401 and the light emitting nanostructures S, a transparent electrode layer 442 and a filling layer 418 covering the light emitting nanostructures S, and a first electrode 430 and a second electrode 440, for example, an electrode structure.

The substrate 401 may be provided as a GaN substrate, and may be manufactured by a method of manufacturing a semiconductor substrate according to example embodiments of inventive concepts described above with reference to FIGS. 1 through 12.

The base layer 410 may also be disposed on the substrate 401. The base layer 410 may include a Group III-V compound, such as GaN. The base layer 410 may include, for example, n-GaN doped with an n-type impurity. According to the present example embodiment, the base layer 410 may provide a crystal facet for growing the first conductive semiconductor core 422 as well as function as a contact electrode by being commonly connected to a side of the light emitting nanostructures S.

The insulating layer 416 may be disposed on the base layer 410. The insulating layer 416 may include a silicon oxide or a silicon nitride, and may include at least one of, for example, $SiO_x$, $SiO_xN_y$, $Si_xN_y$, $Al_2O_3$, TiN, AlN, ZrO, TiAlN, and TiSiN. The insulating layer 416 may include a plurality of openings exposing portions of the base layer 410. According to sizes of the plurality of openings, diameters, lengths, locations, and growth conditions of the light emitting nanostructures S may be determined. The plurality of openings may have various shapes, such as a circle, a quadrangle, and a hexagon.

The plurality of light emitting nanostructures S may be disposed at locations corresponding to locations of the plurality of openings, respectively. Each of the light emitting nanostructures S may have a core-shell structure including the first conductive semiconductor core 422 grown from the base layer 410 exposed from the plurality of openings, and the active layer 424 and the second conductive semiconductor layer 426 sequentially formed on a surface of the first conductive semiconductor core 422.

The number of the light emitting nanostructures S included in the semiconductor light emitting device 400 is not limited to the number of those illustrated in FIG. 15, but the semiconductor light emitting device 400 may include, for example, tens or millions of light emitting nanostructures S. The light emitting nanostructures S of the present example embodiment may include a lower hexagonal prism region and an upper hexagonal pyramid region. According to example embodiments, the light emitting nanostructures S may be a pyramid or prism type. The light emitting nanostructures S may have such three-dimensional shapes to have relatively large light emitting surfaces, thereby increasing optical efficiency.

The transparent electrode layer 442 may cover upper and side surfaces of the light emitting nanostructures S, and may be disposed to be connected to each other between adjacent light emitting nanostructures S. The transparent electrode layer 442 may include, for example, indium tin oxide (ITO), aluminum-doped zinc oxide (AZO), indium zinc oxide (IZO), ZnO, GZO (ZnO:Ga), $In_2O_3$, $SnO_2$, CdO, $CdSnO_4$, or $Ga_2O_3$.

The filling layer 418 may be provided between adjacent light emitting nanostructures S, and may be disposed to cover the light emitting nanostructures S and the transparent electrode layer 442 on the light emitting nanostructures S. The filling layer 418 may include a light emitting insulating material, and may contain, for example, $SiO_2$, $SiN_x$, $Al_2O_3$, HfO, $TiO_2$ or ZrO.

The first and second electrodes 430 and 440 may be disposed on the base layer 410 and the transparent electrode layer 442, respectively, in order to be electrically connected to the base layer 410 and the second conductive semiconductor layer 426, respectively.

Because a GaN substrate manufactured by an example embodiment is used as the substrates 201, 301, and 401 respectively included in the semiconductor light emitting devices 200, 300, and 400, crystal quality of semiconductor layers including the active layers 215, 315, and 424 respectively formed above the substrates 201, 301, and 401 may be secured in comparison to use of another substrate such as a sapphire substrate, thereby improving characteristics of the semiconductor light emitting devices 200, 300, and 400. In addition, the substrates 201, 301, and 401 may have large areas so that the semiconductor light emitting devices 200, 300, and 400 and the following semiconductor light emitting device packages 600, 700, and 800 may be manufactured at a wafer level.

Figure 16:
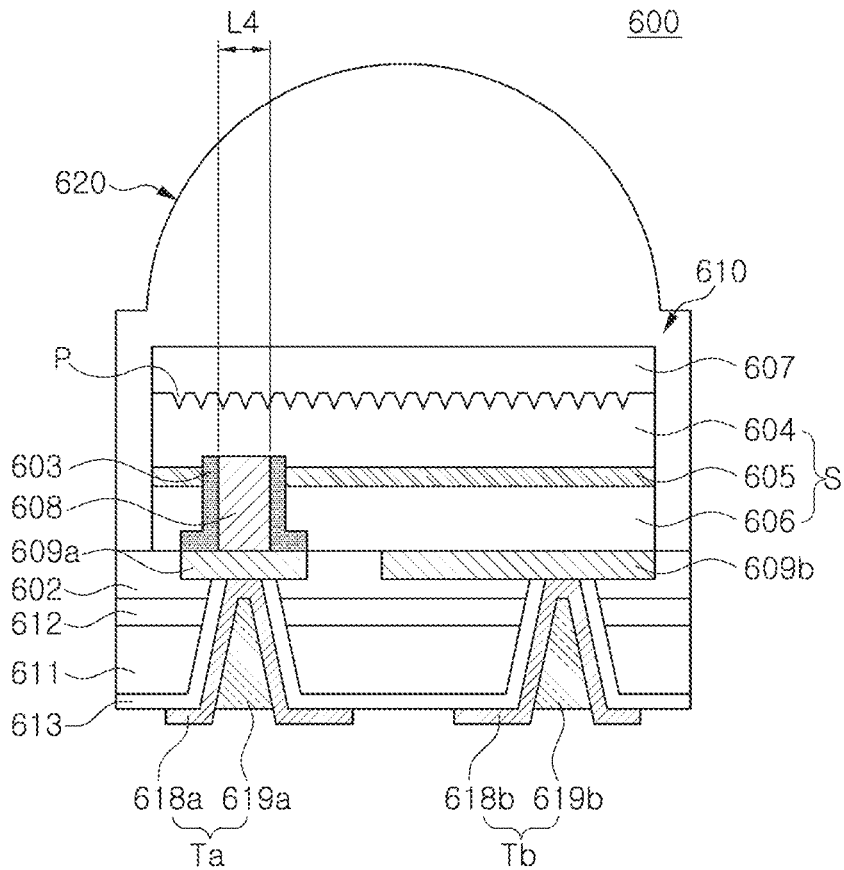
FIGS. 16 through 18 are cross-sectional views of examples of applying semiconductor light emitting devices including a semiconductor substrate manufactured according to example embodiments of inventive concepts to respective semiconductor light emitting device packages, respectively.
Figure 17:
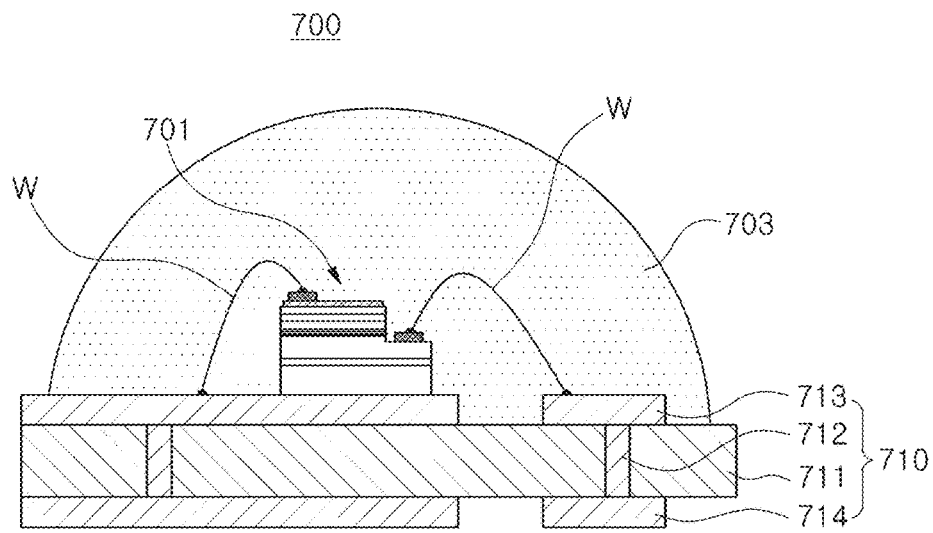
Figure 18:
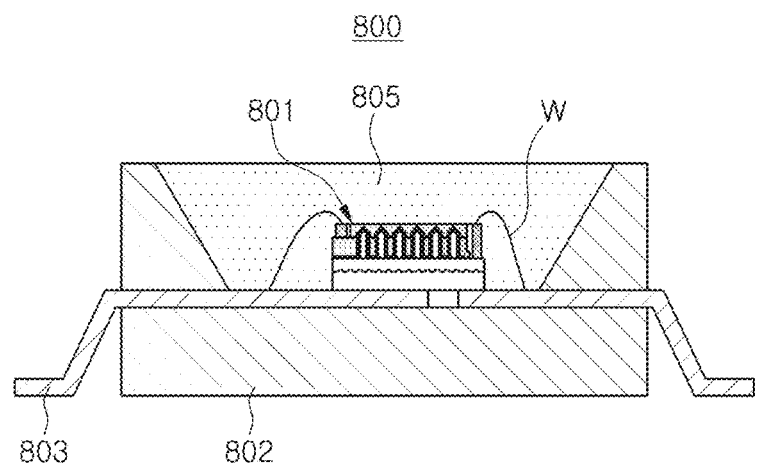

FIGS. 16 through 18 are cross-sectional views of examples of applying semiconductor light emitting devices including a semiconductor substrate according to example embodiments of inventive concepts to respective semiconductor light emitting device packages, respectively.

Referring to FIG. 16, a semiconductor light emitting device package 600 may include a light emitting stack S disposed above a mounting substrate 611, a first terminal Ta, a second terminal Tb, a phosphor layer 607, and a lens 620. The semiconductor light emitting device package 600 may have a chip scale package (CSP) structure in which an electrode is formed on a lower surface of a semiconductor light emitting device 610 in a direction opposite to a principal light extraction surface and the phosphor layer 607 and the lens 620 are integrated with each other.

The light emitting stack S may include a first conductive semiconductor layer 604, a second conductive semiconductor layer 606, and an active layer 605 disposed therebetween. The first and second conductive semiconductor layers 604 and 606 may be provided as p- and n-type semiconductor layers, respectively, and may include a nitride semiconductor, such as $Al_xIn_yGa_{1-x-y}N$ ($0<x<1$, $0<y<1$, $0<x+y<1$). A GaAs-based semiconductor or a GaP-based semiconductor may also be used in addition to, or in the alternative to, the nitride semiconductor.

The active layer 605 formed between the first and second conductive semiconductor layers 604 and 606 may emit light having desired (and/or alternatively predetermined) energy by a recombination of electrons and holes, and may have a multiple quantum well (MQW) structure in which quantum well layers and quantum barrier layers are alternatively stacked on each other. In the case of the MQW structure, for example, an InGaN/GaN or AlGaN/GaN structure may be used.

The semiconductor light emitting device 610 may remain in a state in which a substrate is removed, and may have an unevenness pattern P formed on a surface of the semiconductor light emitting device 610 from which the substrate is eliminated. The phosphor layer 607 as a light conversion layer may also be disposed on the surface on which the unevenness pattern P is formed. The substrate may be manufactured by a method of manufacturing a semiconductor substrate according to example embodiments described above with reference to FIGS. 1 through 12. According to example embodiments, the substrate may not be removed, and the unevenness pattern P and the light conversion layer may be formed on a rear surface of the substrate.

A first electrode 609*a* and a second electrode 609*b* may be connected to the first conductive semiconductor layer 604 and the second conductive semiconductor layer 606, respectively. The first electrode 609*a* may have a conductive via 608 passing through the second conductive semiconductor layer 606 and the active layer 605 to be connected to the second conductive semiconductor layer 606. An insulating layer 603 surrounding the conductive via 608 may limit (and/or prevent) the conductive via 608, the active layer 605, and the second conductive semiconductor layer 606 from short-circuiting. According to the present example embodiment, the conductive via 608 may be exemplarily illustrated, but a plurality of conductive vias 608 may also be arranged in a variety of forms to be advantageous to current distribution. A diameter L4 of the conductive via 608 may also be determined with consideration of an area of the light emitting stack S.

The mounting substrate 611 may be readily applied to a semiconductor process using a silicon substrate or the like, but is not limited thereto. The mounting substrate 611 and the semiconductor light emitting device 610 may be bonded to each other by bonding layers 602 and 612. The bonding layers 602 and 612 may include an insulating material or a conductive material, and may include, for example, an oxide such as $SiO_2$ or SiN, a resin material such as a silicone resin or an epoxy resin, or Ag, Al, Ti, W, Cu, Sn, Ni, Pt, Cr, NiSn, TiW, AuSn, or eutectic metals thereof.

According to example embodiments, the first and second electrodes 609*a* and 609*b* may be connected to the first and second terminals Ta and Tb of the mounting substrate 611, respectively, without the bonding layers 602 and 612. According to example embodiments, the first and second electrodes 609*a* and 609*b* may include a plurality of metal layers, respectively. For example, the first and second electrodes 609*a* and 609*b* may include an under bump metallurgy (UBM) layer and a solder bumper layer including a solder pad. In this case, the mounting substrate 611, the bonding layers 602 and 612, and the first and second terminals Ta and Tb may also be removed.

Referring to FIG. 17, a semiconductor light emitting device package 700 may include a semiconductor light emitting device 701 having a structure identical to that illustrated in FIG. 13, a mounting substrate 710, and an encapsulant 703.

The semiconductor light emitting device 701 may be mounted on the mounting substrate 710 to be electrically connected to the mounting substrate 710 through a wire W. The mounting substrate 710 may include a substrate body 711, an upper electrode 713, a lower electrode 714, and a through electrode 712 connecting the upper electrode 713 to the lower electrode 714. The substrate body 711 may include a resin, a ceramic, or a metal, and the upper or lower electrode 713 or 714 may be provided as a metal layer including a metal such as Au, Cu, Ag, or Al. For example, the mounting substrate 713 may be provided as a substrate such as a PCB, an MCPCB, an MPCB, or an FPCB, and a structure of the mounting substrate 710 may be applied in a variety of forms.

The encapsulant 703 may have a dome-shaped lens structure having a convex upper surface, but according to example embodiments, a surface of the encapsulant 703 may have a convex or concave lens structure, thereby allowing an orientation angle of light emitted through the upper surface of the encapsulant 703 to be adjusted.

Referring to FIG. 18, a semiconductor light emitting device package 800 may include a semiconductor light emitting device 801 having a structure identical to that illustrated in FIG. 15, a package body 802, and a pair of lead frames 803.

The semiconductor light emitting device 801 may be mounted on the pair of lead frames 803, and respective electrodes of the semiconductor light emitting device 801 may be electrically connected to the pair of lead frames 803 by a wire W. According to example embodiments, the semiconductor light emitting device 801 may also be mounted on a region rather than the pair of lead frames 803, such as the package body 802. In addition, the package body 802 may have a recess portion having a cup shape in such a manner that light reflection efficiency may be increased, and an encapsulant 805 including a light transmitting material may be formed in the recess portion to encapsulate the semiconductor light emitting device 801, the wire W, and the like. According to example embodiments, the encapsulant 508 may contain a wavelength conversion material such as a phosphor and/or a quantum dot.

Figure 19A:
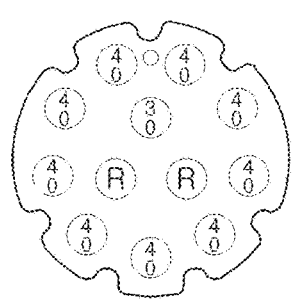
FIGS. 19A and 19B are schematic diagrams of white lighting source modules according to example embodiments of inventive concepts, respectively.
Figure 19B:
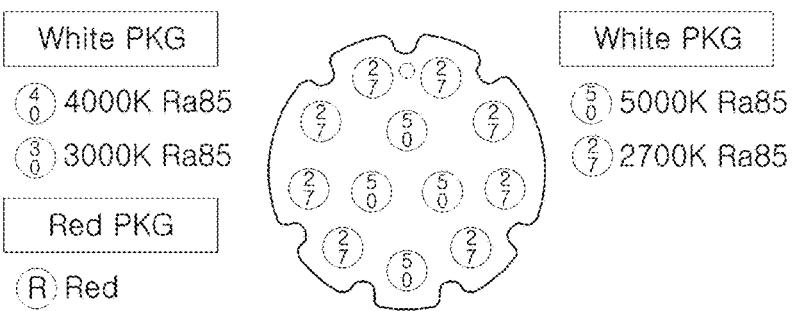

FIGS. 19A and 19B are schematic diagrams of white lighting source modules according to example embodiments of inventive concepts, respectively.

The white light source modules respectively illustrated FIGS. 19A and 19B may include a plurality of light emitting device packages mounted on circuit boards, respectively. A plurality of light emitting device packages mounted in a single white light source module may include the same kind of light emitting device packages generating light having an identical wavelength, or different kinds of light emitting device packages generating light having different wavelengths.

Referring to FIG. 19A, the white light source module may be configured by combining white light emitting device packages 40 having a color temperature of 4,000K and white light emitting device packages 30 having a color temperature of 3,000K with red light emitting device packages RED. The white light source module may emit white light having a color temperature in a range of 3,000K to 4,000K and a color rendering index in a range of 85 Ra to 100 Ra.

According to example embodiments, a white light source module may only include a white light emitting device package, and may include a white light emitting device package emitting white light having a color temperature different from that of the white light source module of FIG. 19A. For example, as illustrated in FIG. 19B, a combination of a white light emitting device package 27 having a color temperature of 2,700K and a white light emitting device package 50 having a color temperature of 5,000K may allow white light having a color temperature in a range of 2,700K to 5,000K and a color rendering index in a range of 85 Ra to 99 Ra to be emitted. Here, the number of light emitting device packages having respective color temperatures may mostly vary depending on default color temperature settings. For example, if a lighting device has a default color temperature setting approximate to 4,000K, the lighting device may include light emitting device packages having a color temperature of 4,000K that are more than light emitting device packages having a color temperature of 3,000K or red light emitting device packages.

As such, different kinds of light emitting device packages may include at least one of violet, blue, green, red and infrared light emitting device packages in a light emitting device package in which a blue light emitting device is combined with a yellow, green, red, or orange phosphor to emit white light, thereby adjusting a color temperature and a color rendering index (CRI) of white light.

The white light source module may also be used as a light source module 2040 of a bulb-type lighting device (refer to FIG. 21) described below.

A single light emitting device package may determine a required color of light depending on wavelengths of an LED chip, for example, a light emitting device, and on types and mixing ratios of phosphors. Whereby, a white light emitting device package may adjust a color temperature and a color rendering index of white light.

For example, when the LED chip emits blue light, a light emitting device package including at least one of yellow, green, and red phosphors may emit white light having a variety of color temperatures depending on mixing ratios of the at least one of the yellow, green, and red phosphors. Conversely, a light emitting device package in which a green or red phosphor is applied to a blue LED chip may emit green or red light. As such, a combination of alight emitting device package emitting white light and alight emitting device package emitting green or red light may allow a color temperature and a color rendering index of white light to be adjusted. In addition, the light emitting device package may include at least one light emitting device emitting violet, blue, green, red, or infrared light.

In this case, alighting device may adjust a CRI of a sodium (Na) lamp to the level of sunlight, and may emit white light having various color temperatures in a range of 1,500K to 20,000K. If necessary, the lighting device may emit violet, blue, green, red, and orange visible light or infrared light to adjust a lighting color according to the lighting device's surroundings or desired moods. The lighting device may also emit light having a certain wavelength that is able to promote plant growth.

Figure 20:
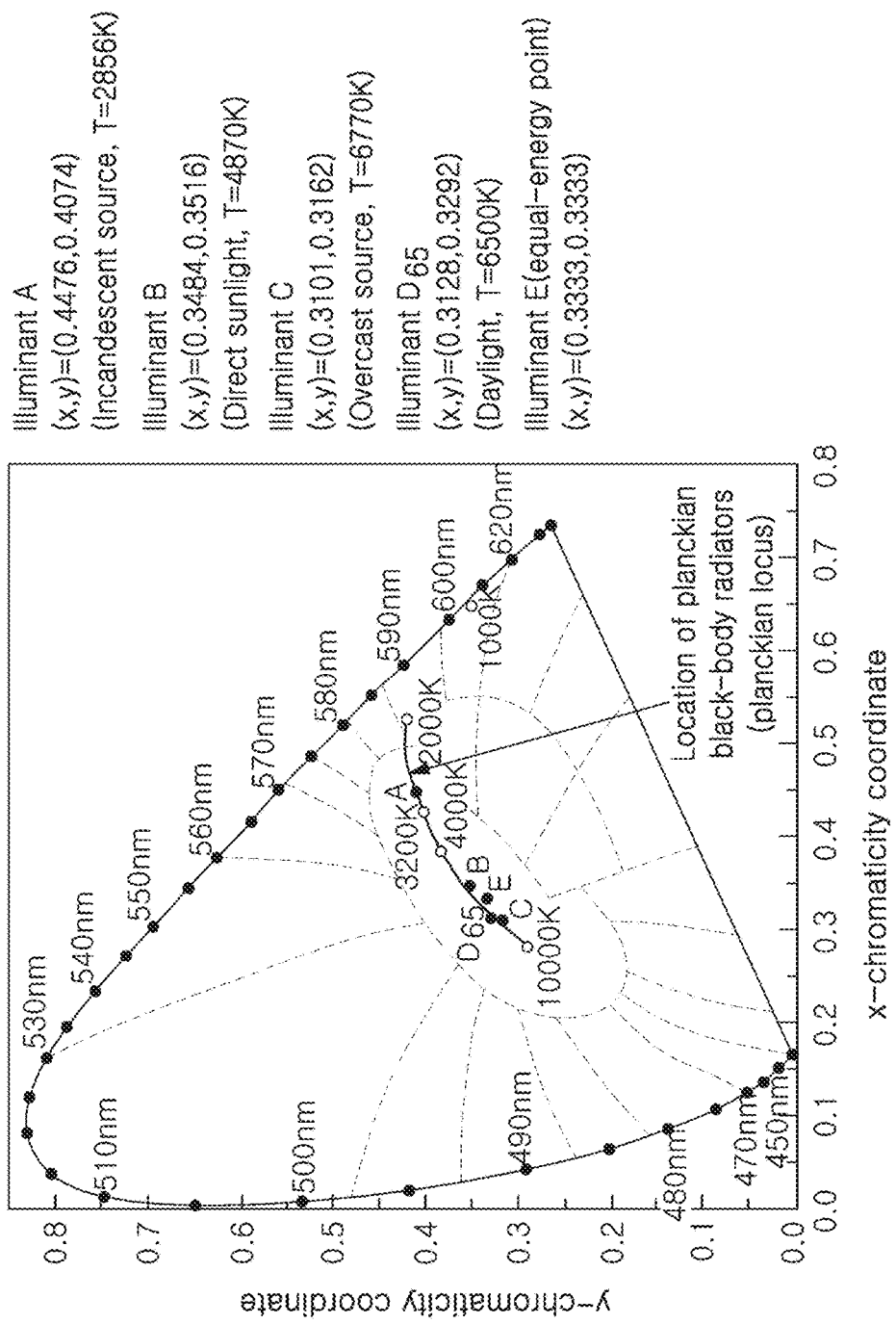
FIG. 20 is a CIE 1931 color space chromaticity diagram illustrating a wavelength conversion material employable in a semiconductor light emitting device package according to example embodiments of inventive concepts.

White light generated by combinations of a blue light emitting device with yellow, green, red phosphors and/or green and red light emitting devices may have at least two peak wavelengths, and as illustrated in FIG. 20, (x,y) coordinates of the CIE 1931 color space chromaticity diagram may be located in an area of segments connecting coordinates: (0.4476, 0.4074), (0.3484, 0.3516), (0.3101, 0.3162), (0.3128, 0.3292), and (0.3333, 0.3333). Alternatively, (x,y) coordinates may be located in an area surrounded by the segments and a blackbody radiation spectrum. A color temperature of the white light may range from 1,500K to 20,000K. As illustrated in FIG. 20, white light adjacent to Point E (0.3333, 0.3333) below the blackbody radiation spectrum may be used as a light source for lighting to create clearer viewing conditions for the naked eye in a state in which light having a yellow-based component is relatively reduced. Thus, a lighting product using white light adjacent to Point E (0.3333, 0.3333) below the blackbody radiation spectrum may be useful as lighting for a retail space in which consumer goods are sold.

Various types of materials such as a phosphor and a quantum dot may be used as a material converting a wavelength of light emitted by a semiconductor light emitting device.

The phosphor may have the following formulae and colors: yellow and green $Y_3Al_5O_{12}$:Ce, yellow and green $Tb_3Al_5O_{12}$:Ce, and yellow and green $Lu_3Al_5O_{12}$:Ce (oxide-based); yellow and green $(Ba,Sr)_2SiO_4$:Eu and yellow and orange $(Ba,Sr)_3SiO_5$:Ce (silicate-based); green β-SiAlON: Eu, yellow $La_3Si_6N_{11}$:Ce, orange α-SiAlON:Eu, red $CaAlSiN_3$:Eu, red $Sr_2Si_5N_8$:Eu, red $SrSiAl_4N_7$:Eu, red $SrLiAl_3N_4$: Eu, and red $Ln_{4-x}(Eu_zM_{1-z})_xSi_{12-y}Al_yO_{3+x+y}N_{18-x-y}$ (0.5≤x≤3, 0<z<0.3, 0<y≤4) (where Ln may be at least one kind of element selected from the group consisting of group IIIA elements and rare earth elements, and M may be at least one kind of element selected from the group consisting of Ca, Ba, Sr and Mg) (nitride-based); and KSF-based red $K_2SiF_6$:$Mn^{4+}$, KSF-based red $K_2TiF_6$:$Mn^{4+}$, KSF-based red $NaYF_4$:$Mn^{4+}$, KSF-based red $NaGdF_4$:$Mn^{4+}$, and KSF-based red $K_3SiF_7$:$Mn^{4+}$ (fluoride-based).

A phosphor composition may be required to conform with stoichiometry, and respective elements thereof may be replaced by other elements in each group on the periodic table. For example, Sr may be substituted with Ba, Ca, Mg, and the like of alkaline earth metals (group II), and Y may be replaced with Tb, Lu, Sc, Gd, and the like of lanthanides. Eu or the like, an activator, may be substituted with Ce, Tb, Pr, Er, Yb, and the like according to required energy levels. An activator may only be applied to the phosphor composition, or an additional sub activator or the like may be applied to the phosphor composition to modify characteristics thereof.

In particular, a fluoride-based red phosphor may be coated with a fluoride not containing Mn, respectively, or may further include an organic coat on a surface of the fluoride-based red phosphor or on a surface of the fluoride-based red phosphor coated with a fluoride not containing Mn, in order to improve reliability at high temperatures and high humidity. In the case of the fluoride-based red phosphor described above, since a narrow full width at half maximum (FWHM) less than or equal to 40 nm may be implemented unlike other phosphors, the fluoride-based red phosphor may be used for a high-resolution television, such as a UHD TV.

Table 1 below indicates types of phosphors for application fields of white light emitting devices using a blue LED chip (440 nm to 460 nm) and an UV LED chip (380 nm to 430 nm).

TABLE 1

| Use | Phosphor |
|---|---|
| LED TV BLU | $\beta$-SiAlON:$Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Lighting | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Side View (Mobile, Laptop) | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, (Sr, Ba, Ca, Mg)$_2$SiO$_4$:$Eu^{2+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 + y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Electronic device (Head Lamp, etc.) | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 + y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |

In addition, a wavelength converter may be formed using a wavelength conversion material such as a quantum dot (QD), which may be used to replace a phosphor or may be mixed with a phosphor.

Figure 21:
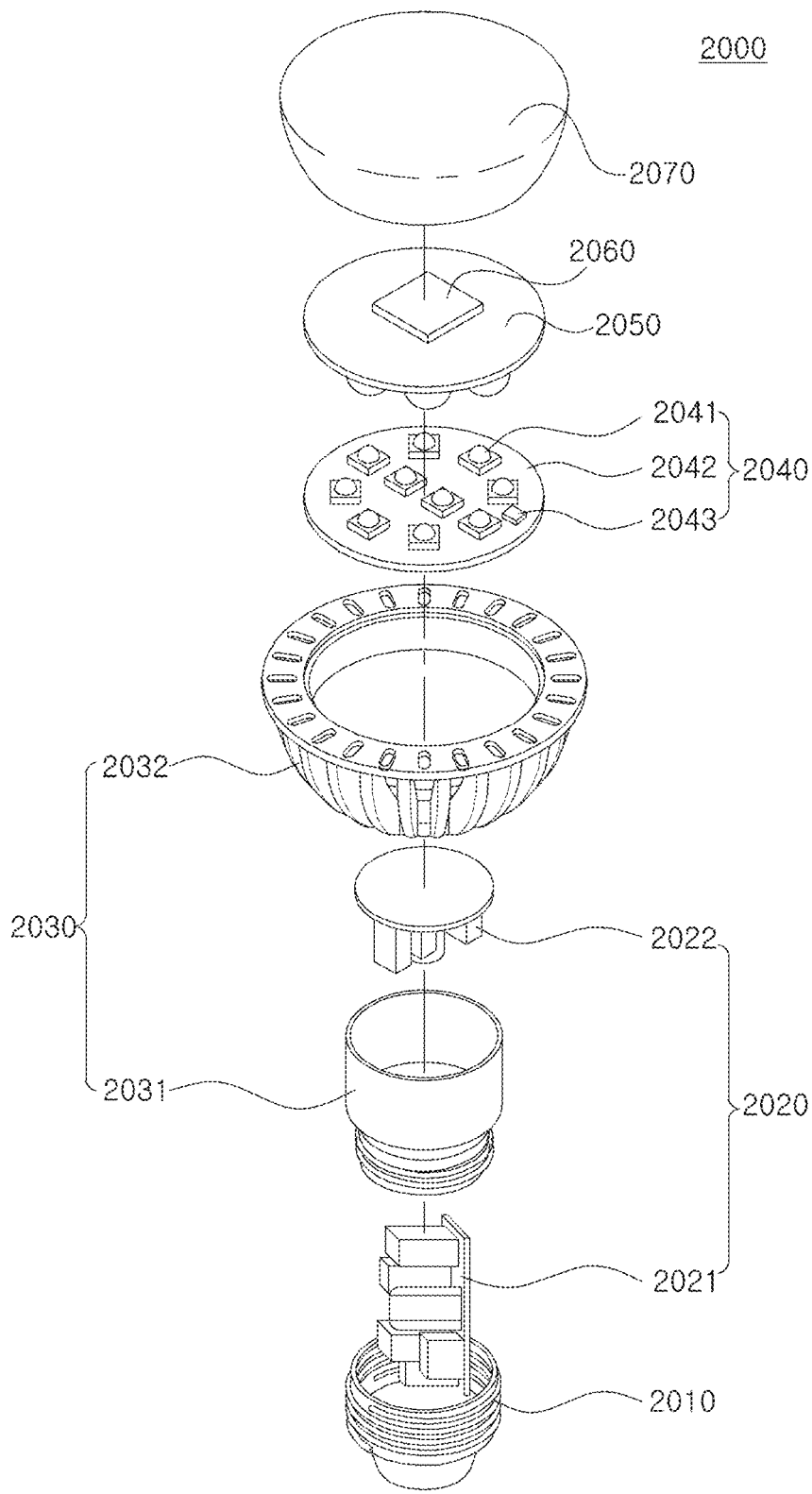
FIG. 21 is a schematic exploded perspective view of a lamp including a communications module as a lighting device according to example embodiments of inventive concepts.

FIG. 21 is a schematic exploded perspective view of a lamp including a communications module as a lighting device according to example embodiments of inventive concepts.

Referring to FIG. 21, a lighting device 2000 may include a socket 2010, a power supply 2020, a heat sink 2030, a light source module 2040, and an optical unit 2070.

Power supplied to the lighting device 2000 may be applied through the socket 2010. The socket 2010 may be configured to replace that of a conventional lighting device. As illustrated in FIG. 21, the power supply 2020 may be attached with a first power supply unit 2021 and a second power supply unit 2022. The heat sink 2030 may include an internal heat sink 2031 and an external heat sink 2032. The internal heat sink 2031 may be directly connected to the light source module 2040 and/or the power supply 2020. This may allow heat to be transferred to the external heat sink 2032. The optical unit 2070 may be configured to evenly scatter light emitted by the light source module 2040.

The light source module 2040 may receive power from the power supply 2020 to emit light to the optical unit 2070. The light source module 2040 may include at least one light emitting device 2041, a circuit board 2042, and a controller 2043, and the controller 2043 may store driving information of the at least one light emitting device 2041. The at least one light emitting device 2041 may include a substrate manufactured by a method of manufacturing a semiconductor substrate according to example embodiments described above with reference to FIGS. 1 through 12, or may be manufactured using the substrate.

A reflector 2050 may be included above the light source module 2040, and may reduce glare by evenly diffusing light emitted by the light emitting devices 4241 to a side surface and rear of the reflector 2050. A communications module 2060 may be mounted on an upper portion of the reflector 2050, and may perform home network communications. For example, the communications module 2060 may be a wireless communications module using Zigbee®, wireless fidelity (Wi-Fi), or light fidelity (Li-Fi), and may control on and off functions and brightness of a lighting device installed in and around a home through a smartphone or a wireless controller. Further, use of a Li-Fi communications module using a visible light wavelength of a lighting device installed in and around residential, commercial, or industrial spaces may control electronics such as a TV, a refrigerator, an air-conditioner, a door lock, or may control a vehicle. The reflector 2050 and the communications module 2060 may be covered with the optical unit 2070.

Figure 22:
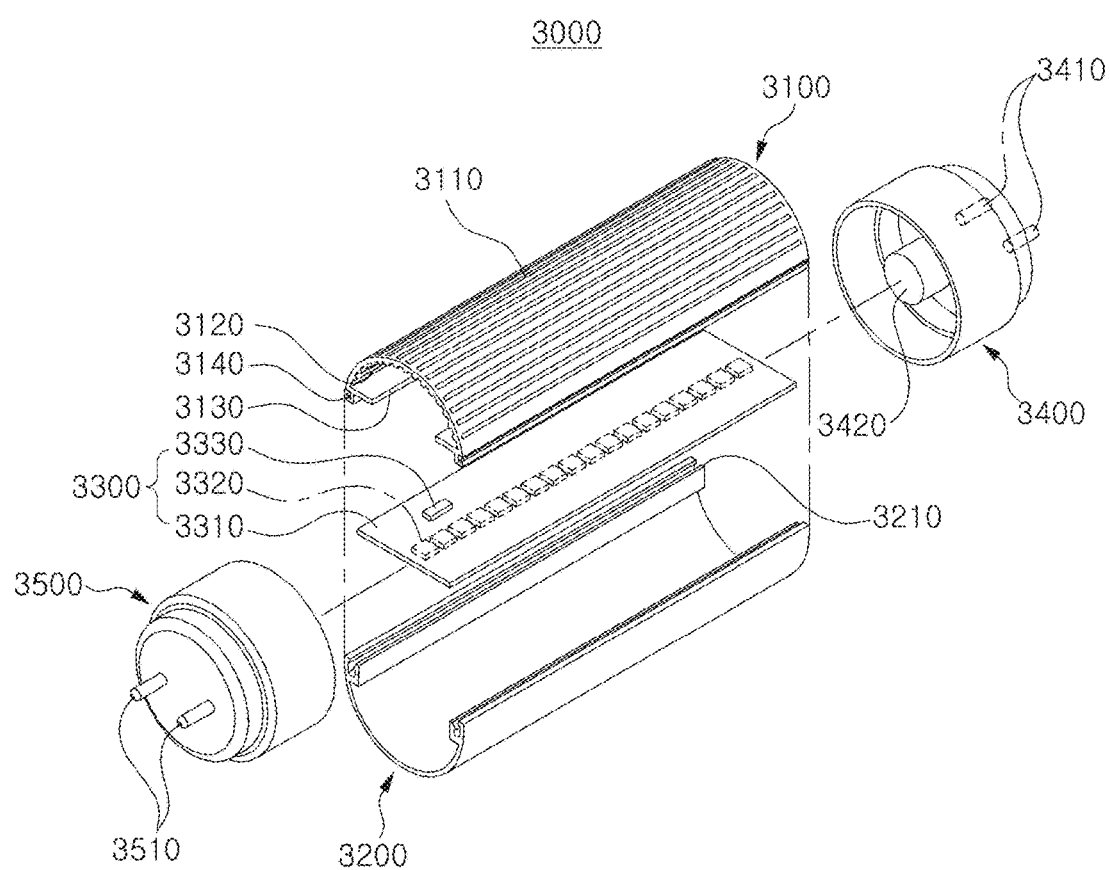
FIG. 22 is a schematic exploded perspective view of a bar-type lamp as a lighting device according to example embodiments of inventive concepts.

FIG. 22 is a schematic exploded perspective view of a bar-type lamp as a lighting device according to example embodiments of inventive concepts.

Referring to FIG. 22, a lighting device 3000 may include a heat sink 3100, a cover 3200, a light source module 3300, a first socket 3400 and a second socket 3500.

A plurality of heat sink fins 3110 and 3120 may be formed on internal or/and external surfaces of the heat sink 3100 to have uneven shapes, and may be designed to have various shapes and intervals. The heat sink 3100 may have protruding supports 3130 formed on an inside thereof. The protruding supports 3130 may be fixed to the light source module 3430. The heat sink 3100 may have protrusions 3140 respectively formed on opposing ends thereof.

The cover 3200 may have grooves 3210 formed therein, and the protrusions 3140 of the heat sink 3100 may be coupled to the grooves 3210 by a hook coupling structure, respectively. Locations of the grooves 3210 and the protrusions 3140 may be reversed with each other.

The light source module 3300 may include a light emitting device array. The light source module 3300 may include a printed circuit board (PCB) 3310, light sources 3320, and a controller 3330. The light sources 3320 may include a substrate manufactured by a method of manufacturing a semiconductor substrate according to example embodiments described above with reference to FIGS. 1 through 12, or may be manufactured using the substrate. The controller 3330 may store driving information of the light sources 3320. The PCB 3310 may have circuit lines operating the light sources 3320, and may also include components operating the light sources 3320.

The first and second sockets 3400 and 3500 as a pair of sockets may have a structure in which the first and second sockets 3400 and 3500 are coupled to both ends of a cylindrical cover unit configured of the heat sink 3100 and the cover 3200, respectively. For example, the first socket 3400 may include electrode terminals 3410 and a power supply 3420, and the second socket 3500 may include dummy terminals 3510 disposed thereon. In addition, one of the first and second sockets 3400 and 3500 may have an optical sensor and/or a communications module built therein. For example, the second socket 3500 with the dummy terminals 3510 disposed thereon may have an optical sensor and/or a communications module built therein. As another example, the first socket 3400 with the electrode terminals 3410 disposed thereon may have an optical sensor and/or a communications module built therein.

Figure 23:
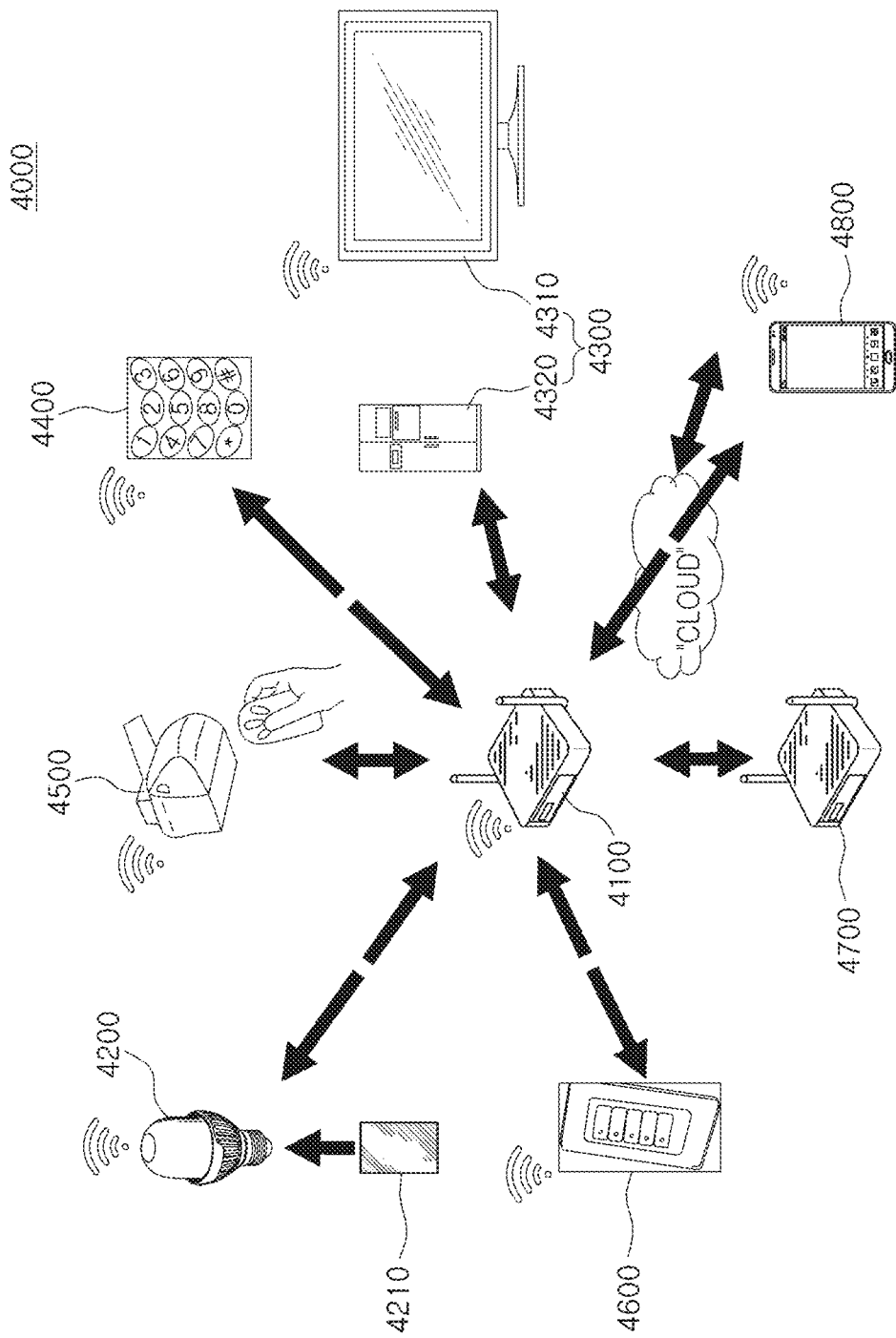
FIG. 23 is a schematic diagram of an indoor lighting control network system.

FIG. 23 is a schematic diagram of an indoor lighting control network system.

A network system 4000 according to example embodiments may be a complex smart lighting-network system in which lighting technology, Internet of Things (IoT) technology, wireless communications technology, and the like using a light emitting device, such as an LED, converge. The network system 4000 may be implemented using various types of lighting devices and wired and wireless communications devices, and may be realized by a sensor, a controller, a communications unit, software for network control and maintenance, and the like.

The network system 4000 may be applied to an open space such as a park or a street, as well as a closed space defined within a building, such as a home or an office. The network system 4000 may be implemented on the basis of an IoT environment to collect and process various pieces of information and provide the collected and processed information to a user. At this time, an LED lamp 4200 included in the network system 4000 may function to check and control operational states of other devices 4300 to 4800 included in the IoT environment on the basis of a function of the LED lamp 4200, such as visible light communications, as well as to receive information regarding surroundings from a gateway 4100 to control lighting of the LED lamp 4200 itself.

Referring to FIG. 23, the network system 4000 may include the gateway 4100 processing data transmitted and received according to different communications protocols, the LED lamp 4200 connected to the gateway 4100 to communicate therewith and including an LED, and the plurality of devices 4300 to 4800 connected to the gateway 4100 to communicate therewith according to various wireless communications schemes. In order to implement the network system 4000 on the basis of the IoT environment, the respective devices 4300 to 4800 including the LED lamp 4200 may include at least one communications module. According to example embodiments, the LED lamp 4200 may be connected to the gateway 4100 to communicate therewith by wireless communications protocols such as Wi-Fi, Zigbee®, and Li-Fi.

As described above, the network system 4000 may be applied to an open space such as a park or a street, as well as a closed space such as a home or an office. When the network system 4000 is applied to a home, the plurality of devices 4300 to 4800 included in the network system 4000 and connected to the gateway 4100 to communicate therewith on the basis of IoT technology may include home appliances 4300, such as a television 4310 or a refrigerator 4320, a digital door lock 4400, a garage door lock 4500, a lighting switch 4600 installed on a wall or the like, a router 4700 for wireless communications network relay, and a mobile device 4800, such as a smartphone, a tablet PC, or a laptop PC.

In the network system 4000, the LED lamp 4200 may check the operational states of the various types of devices 4300 to 4800 or automatically control the luminance of the LED lamp 4200 itself according to surroundings and circumstances using wireless communications networks (Zigbee®, Wi-Fi, Li-Fi, and the like) installed in a home. Use of Li-Fi communications using visible light emitted by the LED lamp 4200 may allow the devices 4300 to 4800 included in the network system 4000 to be controlled.

First, the LED lamp 4200 may automatically control the luminance of the LED lamp 4200 on the basis of surrounding information transmitted from the gateway 4100 through the communications module for a lamp 4210, or surrounding information collected by a sensor mounted to the LED lamp 4200. For example, brightness of the LED lamp 4200 may be automatically controlled according to a type of a program being broadcast on the television 4310 or brightness of an image. To this end, the LED lamp 4200 may receive operation information of the television 4310 from the communications module for a lamp 4210 connected to the gateway 4100. The communications module for a lamp 4210 may be integrally modularized with a sensor and/or a controller included in the LED lamp 4200.

For example, in a case in which a program broadcast on the television 4310 is a drama, a color temperature of illumination may be controlled to be less than or equal to 12,000K, for example, 5,000K, according to desired (and/or alternatively predetermined) setting values to control colors, thereby creating a cozy atmosphere. In a different manner, when a program is a comedy, the network system 4000 may be configured in such a manner that a color temperature of illumination may be increased to 5,000K or more and to be blue-based white lighting according to desired (and/or alternatively predetermined) settings.

When a certain period of time passes after the digital door lock 4400 is locked while there is no person in a home, all LED lamps 4200 turned on may be turned off, and thus a waste of electricity may be limited and/or prevented. Alternatively, when a security mode is set by the mobile device 4800 or the like, if the digital door lock 4400 is locked while there is no person in a home, the LED lamp 4200 may be kept turned on.

Operation of the LED lamp 4200 may be controlled according to surrounding information collected by various sensors connected to the network system 4000. For example, when the network system 4000 is implemented in a building, a light, a position sensor, and a communications module may be combined with each other in the building to collect information on locations of people within the building so that the light may be turned on or off, or the collected information may be provided in real time, thereby enabling facility management or efficient use of an idle space. In general, since a lighting device such as the LED lamp 4200 is disposed in almost all of the spaces on each floor of a building, various pieces of information within the building may be collected by a sensor integrated with the LED lamp 4200, and the collected information may be used to manage facilities or utilize idle spaces.

Meanwhile, a combination of the LED lamp 4200 with an image sensor, a storage device, the communications module for a lamp 4210, and the like may allow the LED lamp 4200 to be utilized as a device that may maintain building security or detect and deal with an emergency. For example, when a smoke or temperature sensor is attached to the LED lamp 4200, the LED lamp 4200 may quickly detect whether a fire or the like occurs, thereby minimizing damage, and may also control the brightness of lighting considering external weather or an amount of sunshine, thereby saving energy and providing a comfortable lighting environment.

Figure 24:
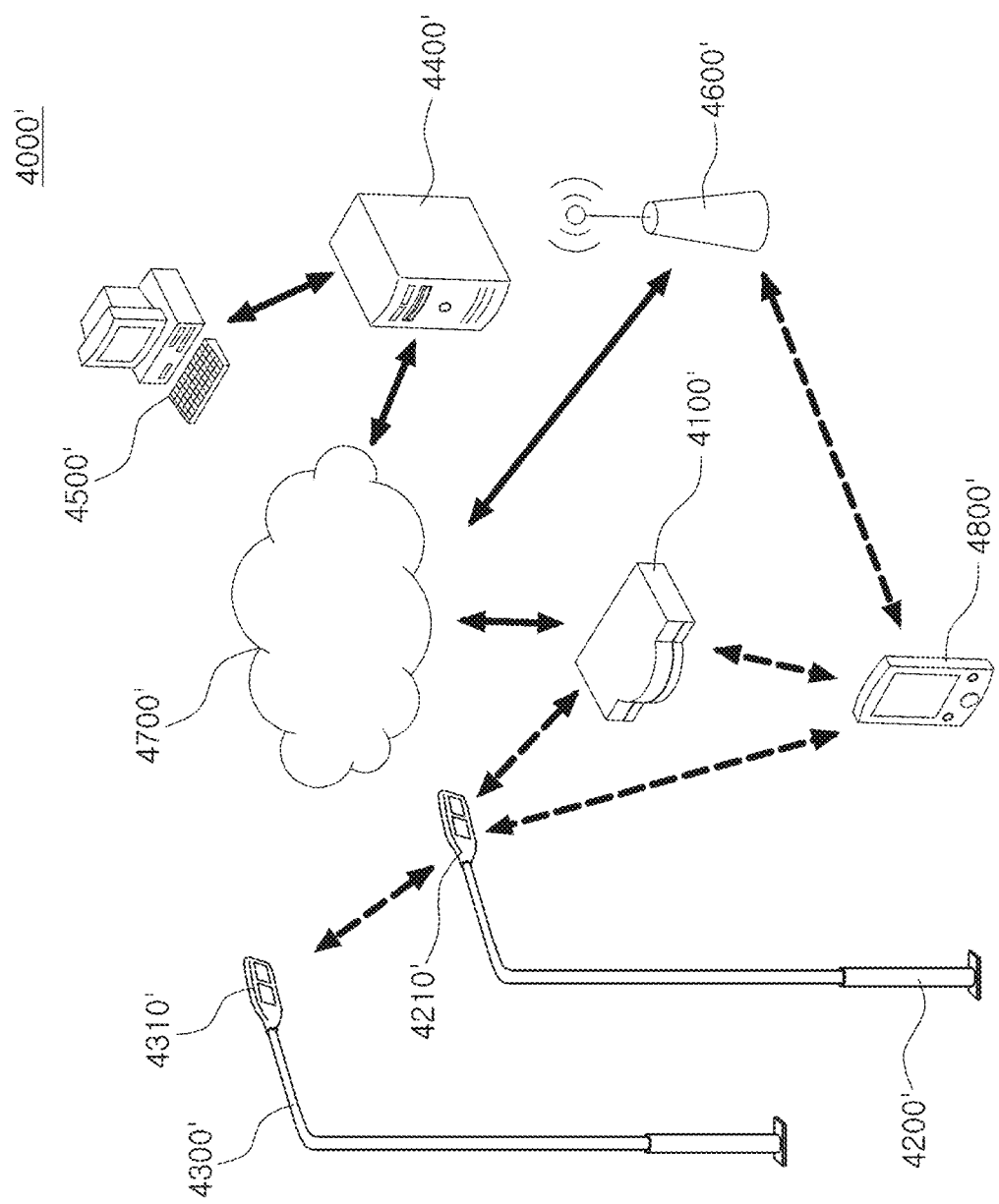
FIG. 24 illustrates an example of a network system applied to an open space.

FIG. 24 illustrates an example embodiment of a network system applied to an open space.

Referring to FIG. 24 a network system 4000' according to the present example embodiment may include a communications connection device 4100', a plurality of lighting fixtures 4200' and 4300' installed at desired (and/or alternatively predetermined) intervals and connected to the communications connection device 4100' to communicate therewith, a server 4400', a computer 4500' managing the server 4400', a communications base station 4600', a communications network 4700' connecting the above-mentioned communicable devices, a mobile device 4800', and the like.

Each of the plurality of lighting fixtures 4200' and 4300' installed in an external open space, such as a street or a park, may include smart engines 4210' and 4310', respectively. Each of the smart engines 4210' and 4310' may include a sensor collecting information regarding surroundings, a communications module, and the like, in addition to a light emitting device emitting light and a driver driving the light emitting device. The communications module may allow the smart engines 4210' and 4310' to communicate with other surrounding devices according to communications protocols, such as Wi-Fi, Zigbee®, and Li-Fi.

As an example, a single smart engine 4210' may be connected to the other smart engine 4310' to communicate therewith. In this case, Wi-Fi extension technology (Wi-Fi mesh) may be applied to communications between the smart engines 4210' and 4310'. At least one smart engine 4210' may be connected to the communications connection device 4100' linked to the communications network 4700' through wired and wireless communications. In order to increase communications efficiency, several smart engines 4210' and 4310' may be grouped into one to be connected to a single communications connection device 4100'.

The communications connection device 4100' may relay communications between the communications network 4700' and other devices, as an access point (AP) that enables wired and wireless communications. The communications connection device 4100' may be connected to the communications network 4700' by at least one wired and wireless communications method, and may be mechanically accommodated in one of the lighting fixtures 4200' and 4300' as an example.

The communications connection device 4100' may be connected to the mobile device 4800' using a communications protocol such as Wi-Fi. A user of the mobile device 4800' may receive information regarding surroundings collected by the plurality of smart engines 4210' and 4310' through the communications connection device 4100' connected to the smart engine 4210' of an adjacent surrounding lighting fixture 4200'. The information regarding the surroundings may include surrounding traffic information, weather information, and the like. The mobile device 4800' may be connected to the communications network 4700' by a wireless cellular communications method, such as 3G or 4G.

Meanwhile, the server 4400' connected to the communications network 4700' may monitor operational states or the like of the respective lighting fixtures 4200' and 4300' while receiving information collected by the smart engines 4210' and 4310' respectively mounted in the lighting fixtures 4200' and 4300'. In order to manage the respective lighting fixtures 4200' and 4300' on the basis of the monitoring results of the operational states of the respective lighting fixtures 4200' and 4300', the server 4400' may be connected to the computer 4500' providing a management system. The computer 4500' may execute software or the like able to monitor and manage operational states of the respective lighting fixtures 4200' and 4300', particularly the smart engines 4210' and 4310'.

Figure 25:
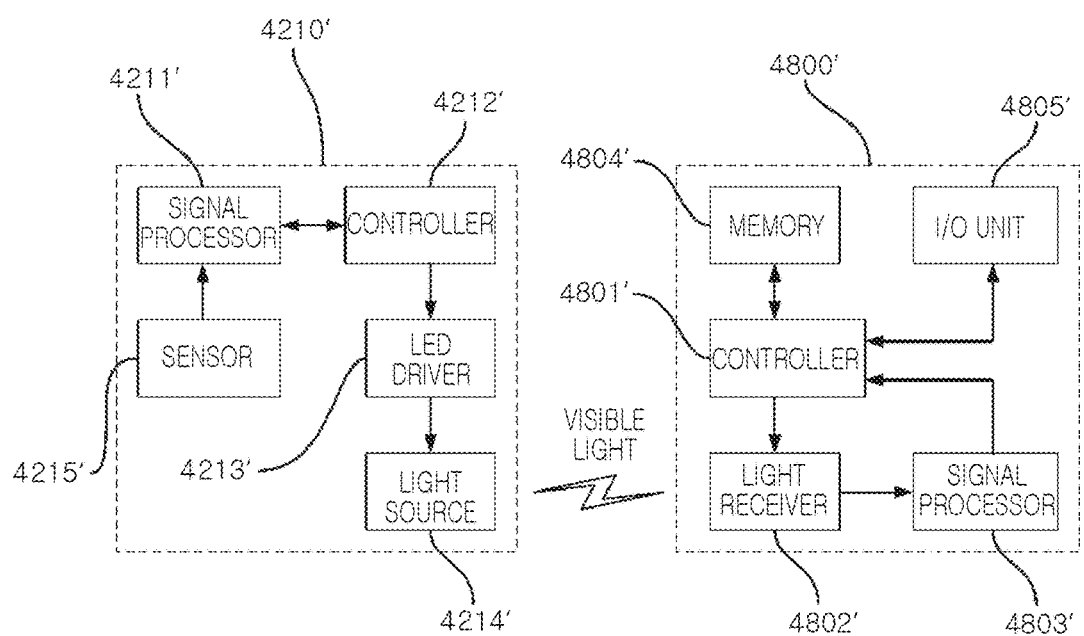
FIG. 25 is a block diagram illustrating communications operations between a smart engine of a lighting fixture and a mobile device by visible light communications.

FIG. 25 is a block diagram illustrating communications operations between a smart engine of a lighting fixture and a mobile device by visible light communications.

Referring to FIG. 25, a smart engine 4210' may include a signal processor 4211', a controller 4212', an LED driver 4213', alight source 4214', a sensor 4215', and the like. A mobile device 4800' connected to the smart engine 4210' through visible light communications may include a controller 4801', a light receiver 4802', a signal processor 4803', a memory 4804', an input/output (I/O) unit 4805', and the like.

Visible light communications technology, Li-Fi, may be used to wirelessly transmit information using light in the visible spectrum that can be recognized by the human eye. Such visible light communications technology may be distinguished from conventional wired optical communications technology and wireless infrared light communications in terms of using light in a visible spectrum, that is, a certain visible light frequency from the light emitting device package described in the example embodiment, and may be differentiated from wired optical communications technology in terms of a wireless communications environment. The visible light communications technology may also be convenient in that the visible light communications technology may be freely used without being restricted or prohibited in terms of use of frequency, unlike radio frequency (RF) wireless communications, may be distinctive in that physical security is excellent and a user may be able to see a communications link with the naked eye, and principally, may have a characteristic of convergence technology that obtains both a unique purpose as a light source and a communications function.

The signal processor 4211' of the smart engine 4210' may process data that is desired to be transmitted and received by visible light communications. As an example, the signal processor 4211' may process information collected by the sensor 4215' into data and transmit the data to the controller 4212'. The controller 4212' may control operations of the signal processor 4211', the LED driver 4213', and the like, and in particular, may control operations of the LED driver 4213' on the basis of data transmitted from the signal processor 4211'. The LED driver 4213' may transmit data to the mobile device 4800' by allowing the light source 4214' to emit light in response to a control signal transmitted from the controller 4212'.

The mobile device 4800' may include the light receiver 4802' recognizing visible light including data in addition to the controller 4801', the memory 4804' storing data, the I/O unit 4805' including a display, a touchscreen, an audio output unit, and the like, and the signal processor 4803'. The light receiver 4802' may detect visible light and convert the detected visible light into an electrical signal, and the signal processor 4803' may decode data included in the electrical signal converted by the light receiver 4802'. The controller 4801' may store the data decoded by the signal processor 4803' to the memory 4804' or output the decoded data through the I/O unit 4805' or the like in such a manner that a user may recognize the decoded data.

As set forth above, according to example embodiments, a method of manufacturing an easily manufactured semiconductor substrate by forming trenches and voids in the semiconductor layers of the growth substrate may be provided.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been shown and described above, it will be apparent to those skilled in the art that modifications and variations could be made without departing from the scope of the claims.

What is claimed is:

1. A method of manufacturing a semiconductor substrate comprising:
    forming a first semiconductor layer on a growth substrate;
    forming a second semiconductor layer on the first semiconductor layer, the second semiconductor layer including a plurality of trenches;
    forming a plurality of voids in the first semiconductor layer by removing portions of the first semiconductor layer exposed by the plurality of trenches;
    forming a third semiconductor layer on the second semiconductor layer and covering the plurality of trenches, the third semiconductor layer being grown from the second semiconductor layer and extending above the second semiconductor layer; and
    separating the second semiconductor layer and the third semiconductor layer integrally from the growth substrate, wherein
    the forming the first semiconductor layer, the forming the second semiconductor layer, the forming the plurality of voids, the forming the third semiconductor layer, and the separating the second semiconductor layer and the third semiconductor layer are performed in situ in a single chamber.

2. The method of claim 1, wherein
    a lattice constant of the first semiconductor layer is different than a lattice constant of the second semiconductor layer, and
    the plurality of trenches are formed by a difference between a value of the lattice constant of the first semiconductor layer and a value of a lattice constant of the second semiconductor layer.

3. The method of claim 1, wherein
    the plurality of trenches pass through the second semiconductor layer, and
    the plurality of trenches are spaced apart from each other, and
    the plurality of trenches include sidewalls that correspond with crystal facets of the second semiconductor layer.

4. The method of claim 1, wherein a lattice constant value of the second semiconductor layer is less than a lattice constant value of the first semiconductor layer.

5. The method of claim 4, wherein the lattice constant value of the second semiconductor layer is 1.2% to 2.4% less than the lattice constant value of the first semiconductor layer.

6. The method of claim 1, wherein the third semiconductor layer covers the plurality of voids in the first semiconductor layer to define closed regions in the first semiconductor layer.

7. The method of claim 1, wherein a thermal expansion coefficient of the growth substrate is different than a thermal expansion coefficient of the third semiconductor layer.

8. The method of claim 1, further comprising:
    stacking an additional first semiconductor layer and an additional second semiconductor layer on the second semiconductor layer prior to the forming the plurality of voids.

9. The method of claim 1, further comprising:
    stacking an additional first semiconductor layer and an additional second semiconductor layer on the second semiconductor layer;
    forming a plurality of voids in the additional second semiconductor layer prior to the forming the third semiconductor layer.

10. The method of claim 1, wherein the forming the plurality of voids includes thermally treating the first semiconductor layer under a hydrogen ($H_2$) atmosphere.

11. The method of claim 1, wherein
    the growth substrate includes a silicon (Si) substrate, and
    the first semiconductor layer includes gallium nitride.

12. The method of claim 1, wherein a thermal expansion coefficient of the growth substrate is different than a thermal expansion coefficient of the third semiconductor layer.

13. The method of claim 1, wherein a lattice constant value of the second semiconductor layer is less than a lattice constant value of the first semiconductor layer,
    the forming the plurality of voids including forming the plurality of voids such that widths of the plurality of voids are greater than widths of the plurality of trenches, and
    a thermal expansion coefficient of the third semiconductor layer is different from a thermal expansion coefficient of the growth substrate.

14. A method of manufacturing a semiconductor substrate comprising:
    forming a plurality of semiconductor layers on a growth substrate,
    the plurality of semiconductor layers including a first semiconductor layer, a second semiconductor layer on the first semiconductor layer, and a third semiconductor layer on the second semiconductor layer,
    the second semiconductor layer including segments laterally spaced apart from each other,
        each of the segments having an upper width that is less than a lower width, and sidewalls corresponding to a crystal facet of the second semiconductor layer,
        a lattice constant value of the second semiconductor layer being less than a lattice constant value of the first semiconductor layer,
        the third semiconductor layer being grown from the second semiconductor layer,
        a thermal expansion coefficient of the third semiconductor layer being different than a thermal expansion coefficient of the growth substrate, and
        the first and third semiconductor layers defining a plurality of closed spaces in the first semiconductor layer below lowermost portions of the third semiconductor layer; and
    separating a stack including the second semiconductor layer and the third semiconductor layer from the growth substrate, the separating the stack including generating cracks in the first semiconductor layer, wherein the forming the plurality of semiconductor layers and the separating the stack are performed in situ in a single chamber.

15. The method of claim 14, wherein the lattice constant value of the second semiconductor layer is 1.2% to 2.4% less than the lattice constant value of the first semiconductor layer.

16. The method of claim 14, wherein
the first semiconductor layer is formed of $Al_xIn_yGa_{1-x-y}N$,
$0 \le x < 1$,
$0 \le y < 1$, and
$0 \le x+y < 1$.

17. The method of claim 14, wherein
the forming the plurality of semiconductor layers includes,
    forming the first semiconductor layer on the growth substrate using one of a metal organic chemical vapor deposition (MOCVD) process and a hydride vapor phase epitaxy (HVPE) process,
    forming the second semiconductor layer on the first semiconductor layer using one of a different MOCVD process and a different HVPE process,
    forming a plurality of voids in the first semiconductor layer using the second semiconductor layer as a mask, and
    forming a third semiconductor layer on the second semiconductor layer, and
the second semiconductor layer has a thickness in a range of 10 nm to 200 nm.

18. The method of claim 7, wherein the forming the third semiconductor layer includes epitaxially growing the third semiconductor layer using a HVPE process to a thickness sufficient for inducing cracks in the first semiconductor layer during the separating the second semiconductor layer and the third semiconductor layer integrally from the growth substrate.

19. The method of claim 14, wherein the forming the plurality of semiconductor layers on the growth substrate includes forming the third semiconductor layer by epitaxially growing the third semiconductor layer using a HVPE process to a thickness sufficient for inducing cracks in the first semiconductor layer during the separating the stack from the growth substrate.

20. The method of claim 18, wherein
the thickness of the third semiconductor layer is in a range of 2 nm to 100 nm,
the separating the second semiconductor layer and the third semiconductor layer integrally from the growth substrate includes inducing the cracks in the first semiconductor layer as the third semiconductor cools due to stress differences between thermal expansion differences between the third semiconductor layer and the growth substrate.

* * * * *